United States Patent
Singh et al.

(10) Patent No.: US 9,911,473 B1
(45) Date of Patent: Mar. 6, 2018

(54) CIRCUIT WITH SELF-ADJUST PRE-CHARGED GLOBAL DATA LINE

(71) Applicant: TAIWAN SEMICONDUCTOR MANUFACTURING COMPANY LTD., Hsinchu (TW)

(72) Inventors: Sahil Preet Singh, Hsinchu (TW); Li-Wen Wang, Taichung (TW); Manish Arora, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/402,716

(22) Filed: Jan. 10, 2017

Related U.S. Application Data

(60) Provisional application No. 62/427,659, filed on Nov. 29, 2016.

(51) Int. Cl.
*G11C 7/12* (2006.01)
*G11C 5/02* (2006.01)
*G11C 5/06* (2006.01)
*G11C 8/08* (2006.01)

(52) U.S. Cl.
CPC .......... *G11C 7/12* (2013.01); *G11C 5/025* (2013.01); *G11C 5/063* (2013.01); *G11C 8/08* (2013.01)

(58) Field of Classification Search
CPC ...................................................... G11C 7/12
USPC ....................................................... 365/203
See application file for complete search history.

(56) References Cited

U.S. PATENT DOCUMENTS

| | | | |
|---|---|---|---|
| 6,654,301 B2 * | 11/2003 | Chehrazi | G11C 7/18 365/204 |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 9,343,125 B2 * | 5/2016 | Tao | G11C 7/12 |
| 2014/0153345 A1 | 6/2014 | Kim et al. | |
| 2014/0233330 A1 | 8/2014 | Ko et al. | |
| 2015/0348598 A1 | 12/2015 | Wang et al. | |
| 2015/0371702 A1 | 12/2015 | Wu et al. | |

(Continued)

*Primary Examiner* — Son Mai
(74) *Attorney, Agent, or Firm* — WPAT, P.C., Intellectual Property Attorneys; Anthony King

(57) ABSTRACT

In some embodiments, a memory device includes a memory bank, a global data line, a first tri-state unit, a latch, a second tri-state unit and a pre-charge unit. The first tri-state unit is configured between the memory bank and the global data line. The latch is configured to provide a state signal based on a data signal from the memory bank. The second tri-state unit is configured between the global data line and the latch. The pre-charge unit pre-charges the global data line to a first intermediate level or a second intermediate level depending on the state signal during the global data line is caused to be electrically isolated from the memory bank by the first tri-state unit and electrically isolated from the latch by the second tri-state unit.

20 Claims, 23 Drawing Sheets

(56) References Cited

U.S. PATENT DOCUMENTS

2015/0380077 A1 12/2015 Wu et al.
2015/0380078 A1 12/2015 Liaw

* cited by examiner

CIRCUIT WITH SELF-ADJUST PRE-CHARGED GLOBAL DATA LINE

PRIORITY CLAIM AND CROSS-REFERENCE

This application claims priority to U.S. Provisional Application Ser. No. 62/427,659 filed on Nov. 29, 2016, and the disclosure of which is hereby incorporated by reference in its entirety.

BACKGROUND

In a multi-bank memory, a global control block is configured to control word line selection of word line decoding blocks, and local bit line selection and bank selection of the local control blocks. The word line decoding blocks apply word line selection to corresponding memory banks. The local control blocks apply local bit line selection and bank selection to corresponding local input and output (10) blocks. The global control block is further configured to control output generation of global IO blocks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
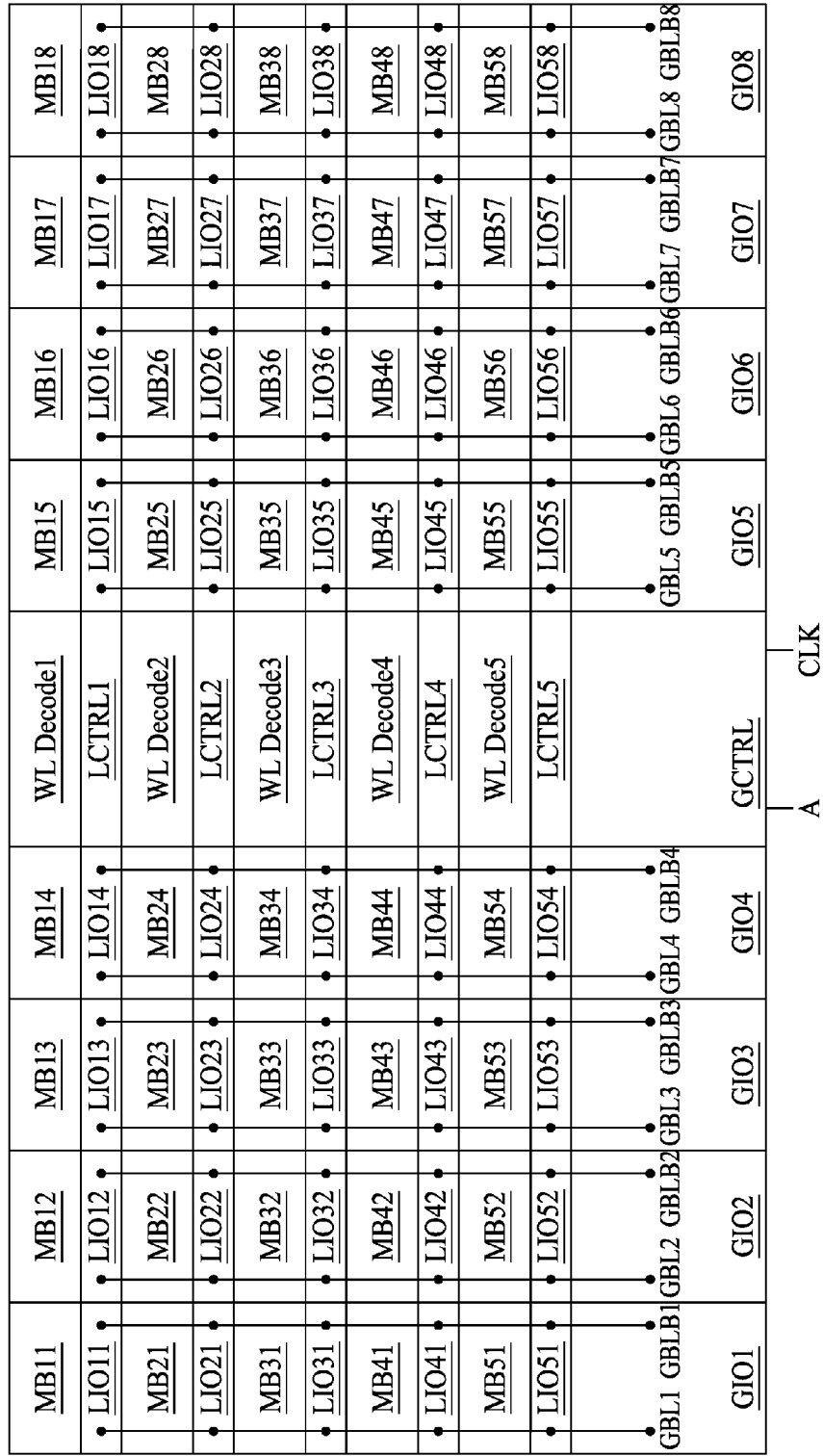
FIG. 1 is a schematic block diagram of a multi-bank memory, in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "vertically," "horizontally," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Same reference numerals among different figures indicate substantially the same elements for one of which description is applicable to the others. Like reference numerals being among related figures and differentiable only with respect to the numerals of the related figures indicate corresponding elements for one of which description is related to and/or compared to some of the others.

It will be understood that when an element is referred to as being "electrically connected to" or "electrically coupled to" another element, it may be directly electrically connected to or electrically coupled to the other element, or intervening elements may be present.

In the below description, a signal is positively asserted with a logical high value to activate a corresponding device when the device is active high. In contrast, the signal is negatively deasserted with a low logical value to deactivate the corresponding device. When the device is active low, however, the signal is negatively asserted with a low logical value to activate the device, and is positively deasserted with a high logical value to deactivate the device.

FIG. 1 is a schematic block diagram of a multi-bank memory 10, in accordance with some embodiments. An exemplary architecture of the multi-bank memory 10 is provided.

In some embodiments, a multi-bank memory 10 includes a plurality of memory banks MB11 to MB58, and associated circuitry arranged in a plurality of rows and a plurality of columns. A first row of the plurality of rows includes memory banks MB11 to M14 and local input and output (10) blocks LIO11 to LIO14, a wordline decoding block WL_Decode1 and a local control block LCTRL1, and memory banks MB15 to M18 and local IO blocks LIO15 to LIO18. The second to fifth rows are constituted similarly as the first row. The sixth row includes global IO blocks GIO1 to GIO4, a global control block GCTRL, and global IO blocks GIO5 to GIO8. A first column of the plurality of columns includes the memory banks MB11 to MB51 and the local IO blocks LIO11 to LIO51, and the global IO block GIO1. The second to fourth columns and the sixth to ninth columns are constituted similarly as the first column. A fifth column includes the wordline decoding blocks WL_Decode1 to WL_Decode5 and the local control blocks LCTRL1 to LCTRL5, and the global control block GCTRL.

The local IO blocks LIO11 to LIO51 and the global IO block GIO1 of the first column is electrically coupled to a global bit line GBL1 and a complementary global bit line GBLB1 (also referred to as global bit line pair GBL1 and GBLB1 throughout the present disclosure) running vertically across the first row to the sixth row. Similarly, the second column to the fourth column has a global bit line pair GBL2 and GBLB2 to a global bit line pair GBL4 to GBLB4, respectively. The sixth column to the ninth column has a global bit line pair GBL5 and GBLB5 to a global bit line pair GBL8 to GBLB8, respectively.

The global control block GCTRL is configured to control word line selection of the word line decoding blocks WL_Decode1 to WL_Decode5, and local bit line selection and bank selection of the local control blocks LCTRL1 to LCTRL5 based on a clock signal CLK and an address signal A. The word line decoding blocks WL_Decode1 to WL_Decode5 apply word line selection to the memory banks MB11 to MB18 in the first row to the memory banks MB51 to MB58 in the fifth row, respectively. The local control blocks LCTRL1 to LCTRL5 apply local bit line selection and bank selection to the local IO blocks LIO11 to LIO18 in the first row to the local control blocks LIO51 to LIO58 in the fifth row, respectively. The global control block GCTRL is further configured to control global bit line pre-charging and output generation of the global IO blocks GIO1 to GIO8 based on the clock signal CLK.

It is noted that a global bit line is also called a global data line because a global bit line (e.g. GBL1) carries data based on a data signal from a memory bank (e.g. MB11). Similarly, a complementary global bit line is also called a complementary global data line because a complementary global bit line (e.g. GBLB1) carries the data based on a complementary data signal from the memory bank (e.g. MB11).

In the embodiments described with reference to FIG. 1, the multi-bank memory 10 has one to one correspondence for the local IO blocks LIO11 to LIO58 and the memory banks MB11 to MB58. The multi-bank memory 10 further has one to one row correspondence for the word line decoding blocks WL_Decode1 to WL_Decode5 and the memory banks MB11 to MB18 in the first row to the memory banks MB51 to MB58 in the fifth row. Such correspondence is exemplary. Other correspondences are within the contemplated scope of the present disclosure. For example, the multi-bank memory 10 has one to two correspondence for local IO blocks and memory banks. The multi-bank memory further has one to two row correspondence for word line decoding blocks and memory banks.

Figure 2:
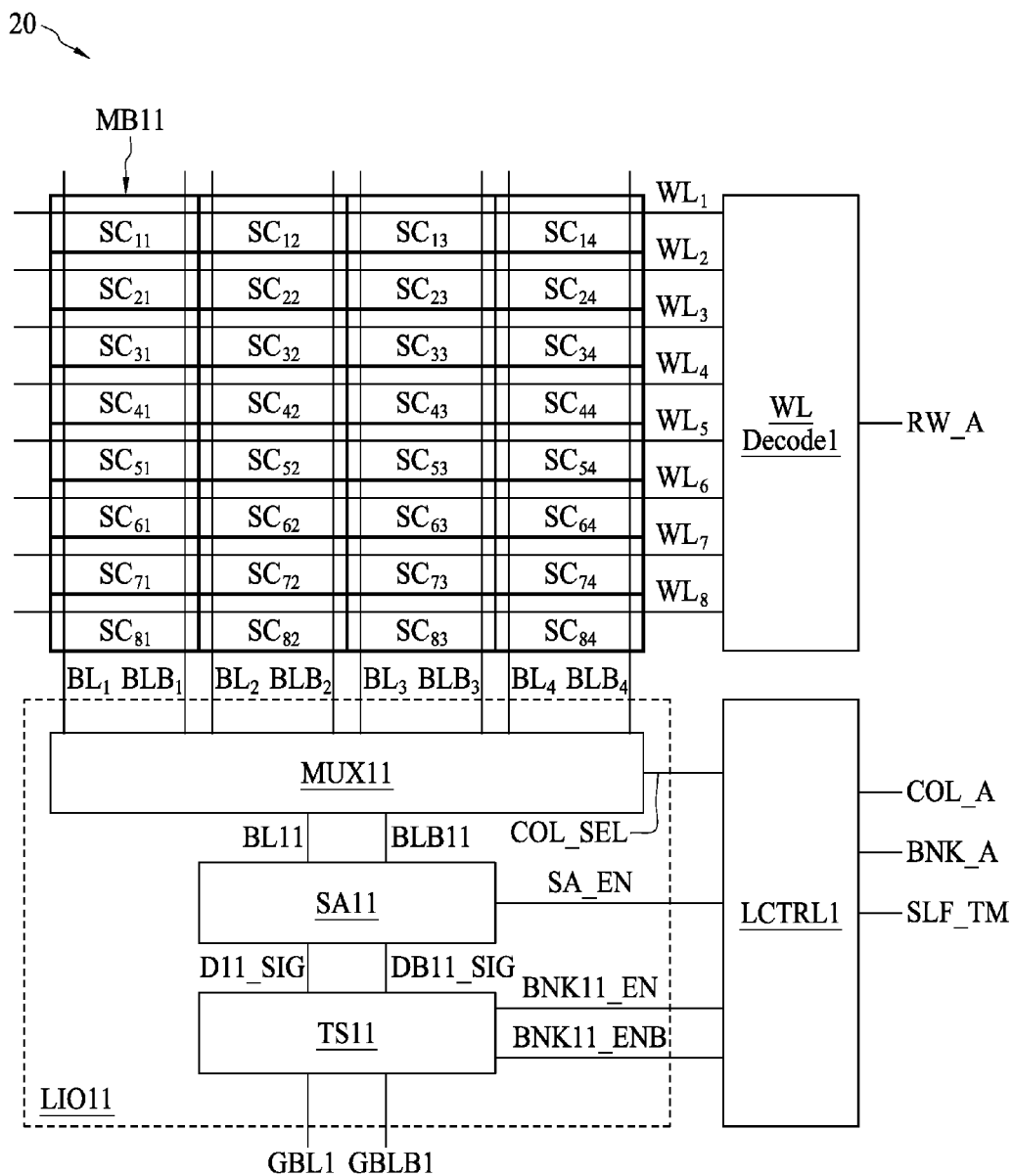
FIG. 2 is a schematic block diagram of an exemplary portion of the multi-bank memory in FIG. 1, in accordance with some embodiments.

FIG. 2 is a schematic block diagram of an exemplary portion 20 of the multi-bank memory 10 in FIG. 1, in accordance with some embodiments. Referring to FIG. 2, in the exemplary portion 20, the word line decoding block WL_Decode1 applies word line selection to the memory bank MB11. In addition, the local control block LCTRL1 applies local bit line selection and bank selection to the local IO block LIO11.

In some embodiments, the exemplary portion 20 includes the memory bank MB11, the local IO block LIO11, the word line decoding block WL_Decode1 and the local control block LCTRL1.

The memory bank MB11 includes an array of memory cells $SC_{11}$ to $SC_{84}$. A plurality of word lines $WL_1$ to $WL_8$ run along a first row of memory cells $SC_{11}$ to $SC_{14}$ to an eighth row of memory cells $SC_{81}$ to $SC_{34}$, respectively. A pair of local bit lines $BL_1$ and $BLB_1$ to a pair of local bit lines $BL_4$ and $BLB_4$ run along a first column of memory cells $SC_{11}$ to $SC_{81}$ to a fourth column of memory cells $SC_{14}$ to $SC_{84}$, respectively.

The word line decoding block WL_Decode1 receives a row address RW_A from the global control block GCTRL. The word line decoding block WL_Decode1 applies word line selection by decoding the row address RW_A and assert, for example, one of the word lines $WL_1$ to $WL_8$ such that a corresponding row of the first row of memory cells $SC_{11}$ to $SC_{14}$ to the eighth row of memory cells $SC_{81}$ to $SC_{84}$ in the memory bank MB11 is selected for access.

The local IO block LIO11 includes a multiplexing unit MUX11, a sense amplifier unit SA11 and a tri-state unit TS11. The local control block LCTRL1 receives a column address COL_A from the global control block GCTRL. The local control block LCTRL1 applies local bit line selection by decoding the column address COL_A and generating a column select signal COL_SEL which causes the multiplexing unit MUX11 to select a corresponding pair of the local bit line pair $BL_1$ and $BLB_1$ to the local bit line pair $BL_4$ and BLB$_4$ to pass data in one cell in the selected row of the first row of memory cells SC$_{11}$ to SC$_{14}$ to the eighth row of memory cells SC$_{81}$ to SC$_{84}$ to a local bit line pair BL11 and BLB11.

The local control block LCTRL1 receives a self-timed signal SLF_TM from the global control block GCTRL, which indicates that, for example, substantial differential voltages have been established in the local bit line pair BL11 and BLB11. In response to the assertion of the self-timed signal SLF_TM, the local control block LCTRL1 asserts a sense amplifier enable signal SA_EN which enables the sense amplifier unit SA11 to perform data sensing at the local bit line pair BL11 and BLB11 and generate a data signal pair D11_SIG and DB11_SIG.

The local control block LCTRL1 receives a bank address BNK_A from the global control block GCTRL. The local control block LCTRL1 applies bank selection by decoding the bank address BNK_A to identify a bank enable signal pair BNK11_EN and BNK11_ENB corresponding to the memory bank MB11 among bank enable signal pairs corresponding to the corresponding memory banks MB11 to MB18 to be asserted. The local control block LCTRL1 then waits for the assertion of the self-time signal SLF_TM to assert the bank enable signal pair BNK11_EN and BNK11_ENB. An assertion pulse width of the bank enable signal pair BNK11_EN and BNK11_ENB is a fixed delay dependent on a size of the multi-bank memory 10 (shown in FIG. 1) In response to the assertions of the bank enable signal pair BNK11_EN and BNK11_ENB, the tri-state unit TS11 allows data signal pairs D11_SIG and DB11_SIG resulted from the memory bank MB11 to be invertedly or non-invertedly passed to the global data line pair GBL1 and GBLB1.

In the embodiments described with reference to FIG. 2, one sense amplifier unit SA11 is arranged after the multiplexing unit MUX11. Other arrangements are within the contemplated scope of the present disclosure. For example, for the local bit line pair BL$_1$ and BLB$_1$ to the local bit line pair BL$_4$ and BLB$_4$, four corresponding sense amplifier units are arranged before the multiplexing unit MUX11.

Figure 3A:
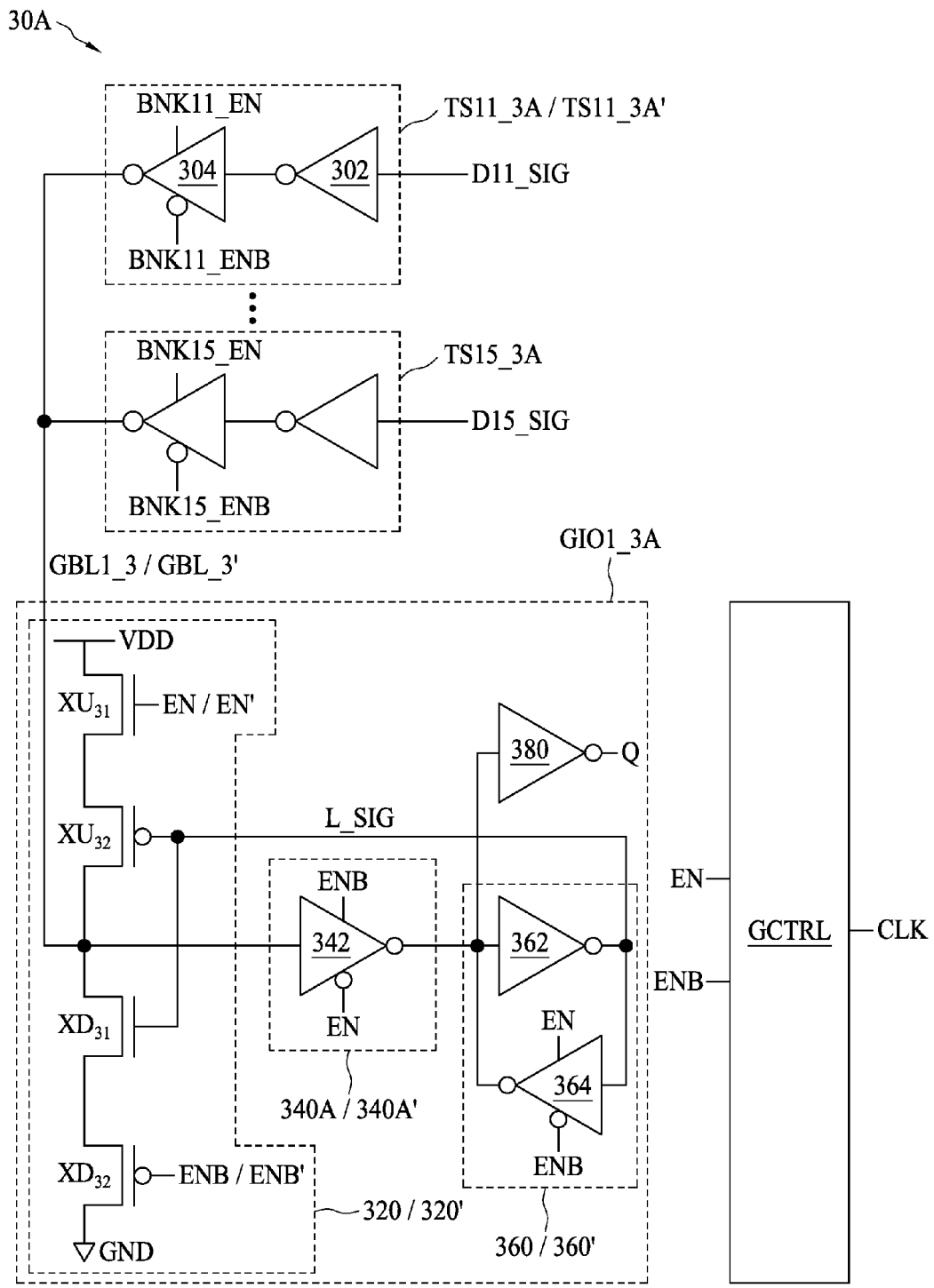
FIG. 3A is a schematic block diagram of an exemplary portion of the multi-bank memory in FIG. 1 with circuits in some of blocks shown, in accordance with some embodiments.

FIG. 3A is a schematic block diagram of an exemplary portion 30A of the multi-bank memory 10 in FIG. 1 with circuits in some of blocks shown, in accordance with some embodiments. Referring to FIG. 3A, in the exemplary portion 30A, internal circuits of the tri-state units TS11_3A to TS15_3A and the global IO block GIO1_3A are illustrated. In addition, the global control block GCTRL controlling the global IO blocks GIO1_3A is also illustrated.

In some embodiments, an exemplary portion 30A includes a tri-state unit TS11_3A in the local IO block LIO11 (exemplarily shown in FIG. 2) to a tri-state unit TS15_3A in the local IO block LIO15, the global bit line GBL1_3, the global IO block GIO1_3A and the global control block GCTRL.

Referring to FIG. 3A, in some embodiments, the tri-state units TS11_3A to TS15_3A correspondingly pass the data signals D11_SIG to D15_SIG to the global bit line GBL1_3 correspondingly in response to the bank enable signal pair BNK11_EN and BNK11_ENB to the bank enable signal pair BNK15_EN and BNK15_ENB. In some embodiments, each of the tri-state units TS11_3A to TS15_3A includes a corresponding cascaded inverter and tri-state inverter 302 and 304. The cascaded inverter and tri-state inverter 302 and 304 of the tri-state unit TS11_3A is described below as an example. An input of the inverter 302 receives the data signal D11_SIG. An output of the inverter 302 is electrically coupled to an input of the tri-state inverter 304. An output of the tri-state inverter 304 is electrically coupled to the global bit line GBL1_3. The tri-state inverter 304 is controlled by the bank enable signal pair BNK11_EN and BNK11_ENB. In response to assertions of the bank enable signal pair BNK11_EN and BNK11_ENB, the tri-state inverter 304 acts as an inverter. In response to deassertions of the bank enable signal pair BNK11_EN and BNK11_ENB, the tri-state inverter 304 is in a high impedance state. Therefore, in response to assertions of one bank enable signal pair (e.g. BNK11_EN and BNK11_ENB) and deassertions of other bank enable signal pairs (e.g. the bank enable signal pair BNK12_EN and BNK12_ENB to the bank enable signal pair BNK15_EN and BNK15_ENB), the tri-state unit (e.g. TS11_3A) allows the data signal (e.g. D11_SIG) resulted from the memory bank (e.g. MB11 shown in FIG. 1) to be non-invertedly passed to the global bit line GBL1_3. In response to deassertions of all of the bank enable signal pair BNK11_EN and BNK11_ENB to the bank enable signal pair BNK15_EN and BNK15_ENB, the tri-state units TS11_3A to TS15_3A electrically isolate the global bit line GBL1 from the corresponding memory banks MB11 to MB15.

The global control block GCTRL generates a control signal pair EN and ENB to control global bit line pre-charging and output generation of the global IO blocks GIO1 to GIO8. In response to, for example, a rising edge of the clock signal CLK, the self-timed signal SLF_TM (described with reference to FIG. 2) is asserted after a certain delay. In response to the assertion of the self-timed signal SLF_TM, the control signal pair EN and ENB are deasserted. An assertion pulse width of the control signal pair EN and ENB is a fixed delay dependent on a size of the multi-bank memory 10 (shown in FIG. 1). In some embodiments, the control signal pair EN and ENB are inverted with respect to any bank enable signal pair (e.g. BNK11_EN and BNK11_ENB) identified from bank selection.

The global IO block GIO1_3A includes a self-adjust pre-charge unit 320, a tri-state unit 340A, a latch 360 and an inverter 380.

In some embodiments, the self-adjust pre-charge unit 320 includes a higher power supply node VDD and a lower power supply node GND, an n-type transistor XU$_{31}$, a p-type transistor XU$_{32}$, an n-type transistor XD$_{31}$ and a p-type transistor XD$_{32}$. The n-type transistor XU$_{31}$ and the p-type transistor XU$_{32}$ are electrically coupled in series between the higher power supply node VDD and the global bit line GBL1_3. For example, the n-type transistor is an n-channel field effect transistor (FET) and the p-type transistor is a p-channel FET. The n-type transistor XU$_{31}$ is controlled by the control signal EN of the control signal pair EN and ENB. The p-type transistor XU$_{32}$ is controlled by a state signal L_SIG. The n-type transistor XD$_{31}$ and the p-type transistor XD$_{32}$ are electrically coupled in series between the global bit line GBL1_3 and the lower power supply node GND. The n-type transistor XD$_{31}$ is controlled by the state signal L_SIG. The p-type transistor XD$_{32}$ is controlled by a control signal ENB of the control signal pair EN and ENB. In response to the assertions of the control signal pair EN and ENB, the n-type transistor XU$_{31}$ and the p-type transistor XD$_{32}$ are conducting. Further in response to the state signal L_SIG, one of the p-type transistor XU$_{32}$ and the n-type transistor XD$_{31}$ is conducting. In response to the deassertions of the control signal pair EN and ENB, the n-type transistor XU$_{31}$ and the p-type transistor XD$_{32}$ are cut off.

The tri-state unit 340A includes a tri-state inverter 342. The latch 360 includes an inverter 362 and a tri-state inverter 364. An input of the tri-state inverter 342 is electrically coupled to the global bit line GBL1_3. An output of the tri-state inverter 342 is electrically coupled to an input of the inverter 362. In response to deassertions of the control signal pair EN and ENB, the tri-state 342 acts as an inverter and therefore electrically couples the global bit line GBL1_3 to the latch 360. In response to assertions of the control signal pair EN and ENB, the tri-state unit 340A is in a high impedance state and therefore electrically isolates the global bit line GBL1_3 from the latch 360. An output of the inverter 362 is electrically coupled to an input of the tri-state inverter 364. An output of the tri-state inverter 364 is electrically coupled to the input of the inverter 362. In response to the assertions of the control signal pair EN and ENB, the tri-state inverter 364 acts as an inverter and therefore the cross-coupled inverters 362 and 364 latch the state signal L_SIG. In response to the deassertions of the control signal pair EN and ENB, the tri-state inverter 364 is in a high impedance state and therefore the latch 360 becomes the inverter 362. The tri-state unit 340A is inverting with respect to the tri-state unit (e.g. TS11_3A). The state signal L_SIG is held at the output of the inverter 362 and the input of the tri-state inverter 364. Therefore, the state signal L_SIG is non-inverting with respect to the data signal (e.g. D11_SIG). The output of the tri-state unit 340A, the input of the inverter 362 and the output of the inverter 364 are further electrically coupled to an inverter 380 which generates an output signal Q.

The term "assertions of a signal pair" such as a bank enable signal pair BNK11_EN and BNK11_ENB and a control signal pair EN and ENB refers to a posit assertion of one signal of the signal pair and a negative assertion of the other signal of the signal pair. In contrast, the term "deassertions of the signal pair" refers to a negative deassertion of the one signal of the signal pair and a positive deassertion of the other signal of the signal pair.

In the embodiments described with reference to FIG. 3A, the control signal pair EN and ENB are described as inverted with respect to any bank enable signal pair (e.g. BNK11_EN and BNK11_ENB) identified from bank selection. Furthermore, the same control signal pair EN and ENB are applied to the self-adjust pre-charge unit 320, the tri-state unit 340A and the latch 360. A self-adjust pre-charge unit 320', a tri-state unit 340A' and a latch 360' controlled respectively by control signal pairs that may have different assertion pulse widths and deassertion pulse widths are within the contemplated scope of the present disclosure. For example, a control signal pair EN and ENB of the tri-state unit 340A' and the latch 360' can be inverted with respect to any bank enable signal pair (e.g. BNK11_EN and BNK11_ENB) identified from bank selection. Therefore, a global bit line GBL_3' remains to be electrically isolated from the memory bank (e.g. MB11) and from the latch 360' during the bank enable signal pair (e.g. BNK11_EN and BNK11_ENB) deassert and the control signal pair EN and ENB assert. The global bit line GBL_3' remains electrically coupled between a tri-state unit TS11_3A' and the latch 360' during the bank enable signal pair (e.g. BNK11_EN and BNK11_ENB) assert and the control signal pair EN and ENB deassert. A control signal pair EN' and ENB' of a self-adjust pre-charge unit 320' has a deassertion pulse width longer than that of the control signal pair EN and ENB, and an assertion pulse width shorter than that of the control signal pair EN and ENB. Therefore, the global bit line GBL_3' is pre-charged within a period that the global bit line GBL_3' remains to be electrically isolated from the memory bank (e.g. MB11) and from the latch 360' and is not pre-charged when the global bit line GBL_3° remains electrically coupled between the tri-state unit TS11_3A' and the latch 360'. Alternative embodiments similar to alternative embodiments described here apply to other embodiments to be described below.

In the embodiments described with reference to FIG. 3A, the latch 360 includes the inverter 362 cross-coupled with the tri-state inverter 364. Other implementations of the latch 360 are within the contemplated scope of the present disclosure. For example, the latch 360 includes an inverter cross-coupled with a normal inverter. For another example, the latch 360 is a D latch. Alternative embodiments similar to alternative embodiments described here apply to other embodiments to be described below.

Figure 3B:
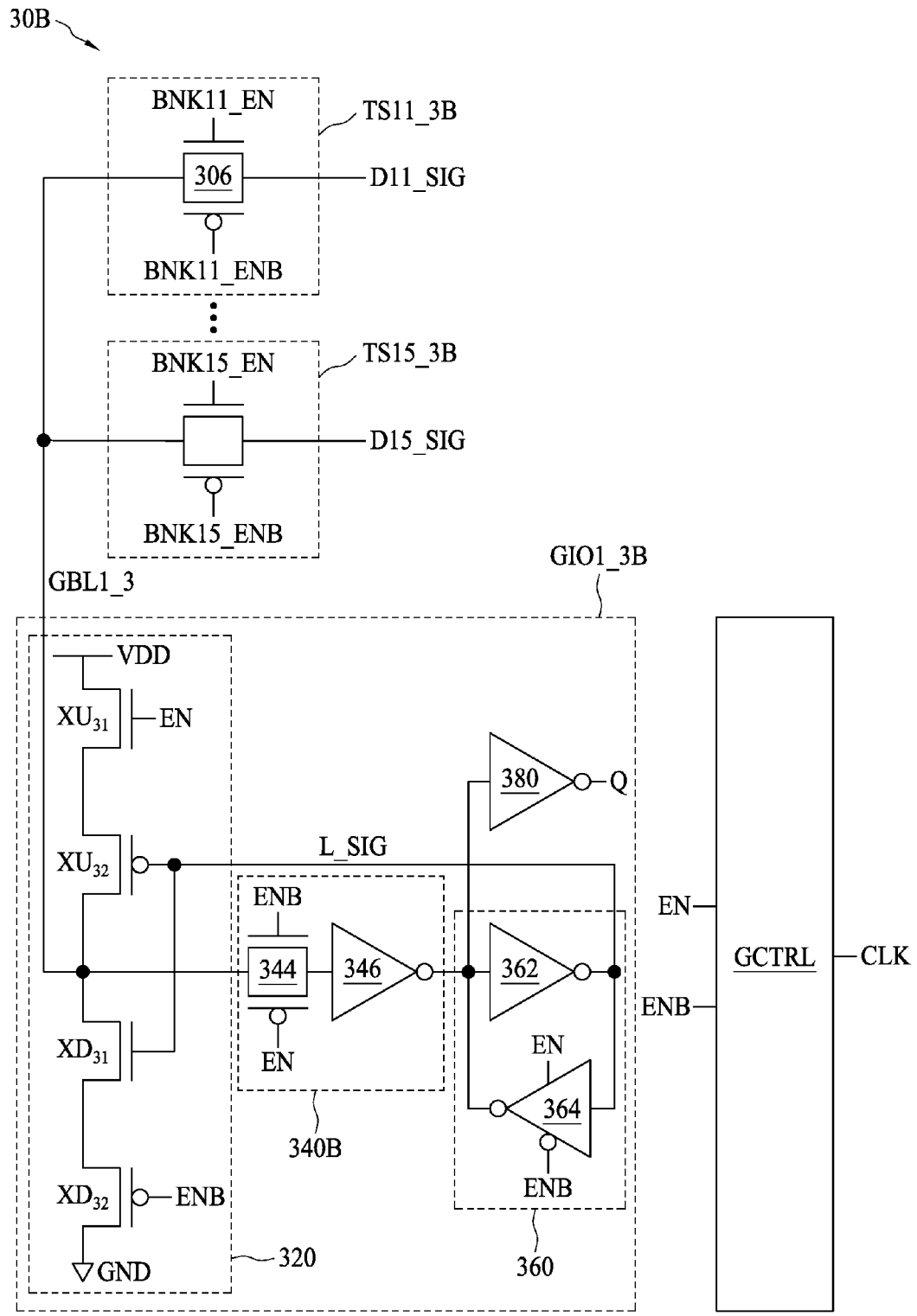
FIG. 3B is a schematic block diagram of an exemplary portion of the multi-bank memory in FIG. 1 with circuits in some of blocks shown, in accordance with some embodiments.

FIG. 3B is a schematic block diagram of an exemplary portion 303 of the multi-bank memory 10 in FIG. 1 with circuits in some of blocks shown, in accordance with some embodiments. Referring to FIG. 3B, compared to the exemplary portion 30A in FIG. 3A, each of tri-state units TS11_3B to TS15_3B includes a corresponding transmission gate 306. The transmission gate 306 functions equivalently as the cascaded inverter and tri-state inverter 302 and 304 in FIG. 3A. In addition, compared to the exemplary portion 30A in FIG. 3A, a tri-state unit 340B includes a cascaded transmission gate and inverter 344 and 346. The cascaded transmission gate and inverter 344 and 346 function equivalently as the tri-state inverter 342 in FIG. 3A. Therefore, operations of the exemplary portion 303 are substantially the same as the operations of the exemplary portion 30A to be described with reference to FIGS. 4A and 43.

Figure 4A:
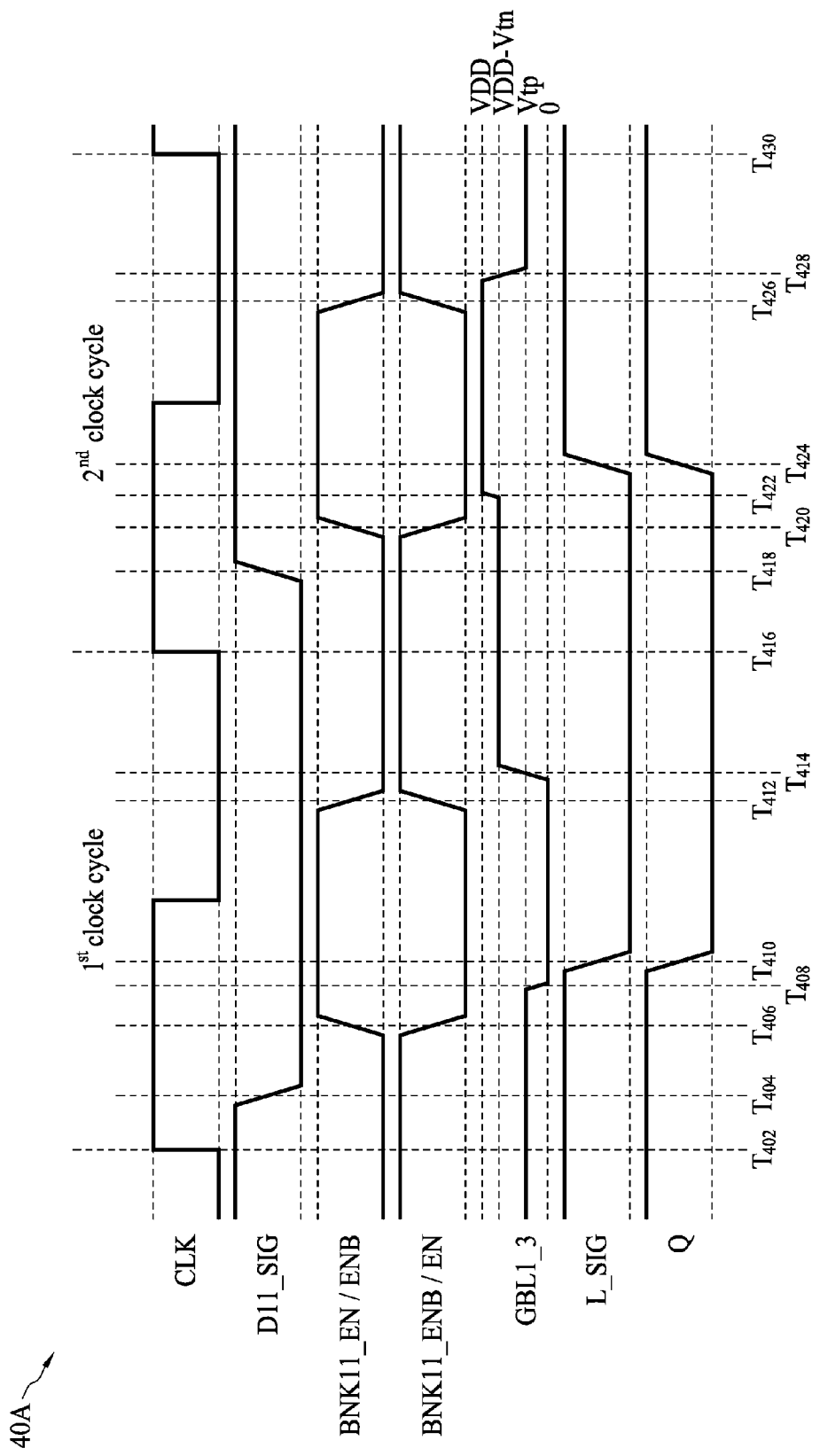
FIG. 4A is a timing diagram for a read 0 operation and a read 1 operation of the exemplary portion in FIG. 3A, in accordance with some embodiments.

FIG. 4A is a timing diagram 40A for a read 0 operation and a read 1 operation of the exemplary portion 30A in FIG. 3A, in accordance with some embodiments. Referring to FIG. 4A, for each read operation, pre-charging the global bit line GBL1_3 to an intermediate level self-adjusted based on the state signal L_SIG is performed and generating the output signal Q based on the data signal D11_SIG passed to the global bit line GBL1_3 is performed.

Referring to both FIG. 3A and FIG. 4A, in some embodiments, during a first clock cycle between rising edges of the clock signal CLK at time $T_{402}$ and time $T_{416}$, a read 0 operation is performed. Before the data signal D11_SIG transitions at time $T_{404}$, the data signal D11_SIG has a logical high value. Before the global bit line GBL1_3 transitions at time $T_{408}$, the global bit line GBL1_3 is pre-charged to a first intermediate level Vtp during a first pre-charge phase. The first pre-charge phase starts from a clock cycle before the first clock cycle and has a portion between time $T_{402}$ and time $T_{406}$ in FIG. 4A. The first pre-charge phase is similar to a third pre-charge phase starting from a second clock cycle and having a portion between time $T_{426}$ and time $T_{430}$ in FIG. 4A to be described in the following. Before the state signal L_SIG and the output signal Q transition at time $T_{410}$, the state signal L_SIG and the output signal Q have the logical high values.

For simplicity, a transition with a finite transition time is described to occur at a particular time instance. Because of the finite transition time, the transition actually starts before the particular time instance and ends after the particular time instance.

Between time $T_{406}$ and time $T_{412}$, bank selection causes assertions of the bank enable signal pair BNK11_EN and BNK11_ENB and dassertions of other bank enable signal pairs which are the bank enable signal pair BNK12_EN and BNK12_ENB to the bank enable signal pair BNK15_EN and BNK15_ENB. During the assertions of the bank enable signal pair BNK11_EN and BNK11_ENB, the control signal pair EN and ENB deasserts. As a result, a first output generation phase of the global IO block GIO1_3A occurs between time $T_{406}$ and time $T_{412}$. In response to the assertions of the bank enable signal pair BNK11_EN and BNK11_ENB of the bank enable signal pair BNK11_EN and BNK11_ENB to the bank enable signal pair BNK15_EN and BNK15_ENB, a corresponding tri-state unit TS11_3A of the tri-state units TS11_3A to TS15_3A allows the data signal D11_SIG resulted from a corresponding memory bank (e.g. MB11 shown in FIG. 1) of the memory banks MB11 to MB51 to be non-invertedly passed to the global bit line GBL1_3. In response to the deassertions of the control signal pair EN and ENB, the n-type transistor $XU_{31}$ and the p-type transistor $XD_{32}$ are cut off. Therefore, the global bit line GBL1_3 transitions to the low logical value at time $T_{408}$ based on the data signal D11_SIG at time $T_{406}$. In response to the deassertions of the control signal pair EN and ENB, the tri-state unit 340A electrically couples the global bit line GBL1_3 to the latch 360. Therefore, at time $T_{410}$, the state signal L_SIG non-inverting with respect to the data signal D11_SIG transitions to the logical low value. At time $T_{410}$, the output signal Q transitions to the logical low value.

In other approaches, a global bit line holds the same value latched based on the data signal D11_SIG in a clock cycle before the first clock cycle. Based on such value of the data signal D11_SIG, the global bit line holds the logical high value initially in the first clock cycle. Then, in the first clock cycle, the global bit line experience a full swing transition from the logical high value to the logical low value. When a width of each memory cell in a memory bank that the global bit line associated with decreases as technology advances, a width of the global bit line is limited. The full swing transition of the global bit line can incur high delay in the global bit line with the limited width. In the present embodiments, the global bit line GBL1_3 is pre-charged to the first intermediate level Vtp during the first pre-charge phase. Therefore, a transition time of the global bit line GBL1_3 from the first intermediate level Vtp to the logical low value during the first output generation phase is faster than a transition time of the full swing transition of the other approaches. Because of the faster transition time of the global bit line GBL1_3, a clock to Q delay from the rising edge of the clock signal CLK at time $T_{402}$ to the transition of the output signal Q at time $T_{410}$ is decreased compared to the other approaches.

Between time $T_{412}$ and time $T_{420}$, all of the bank enable signal pair BNK11_EN and BNK11_ENB to the bank enable signal pair BNK15_EN and BNK15_ENB deassert. During the deassertions of all of the bank enable signal pair BNK11_EN and BNK11_ENB to the bank enable signal pair BNK15_EN and BNK15_ENB, the control signal pair EN and ENB asserts. As a result, a second pre-charge phase of the global IO block GIO1_3A occurs between time $T_{412}$ and $T_{420}$. In response to the deassertions of all of the bank enable signal pair BNK11_EN and BNK11_ENB to the bank enable signal pair BNK15_EN and BNK15_ENB, the tri-state units TS11_3A to TS15_3A electrically isolate the global bit line GBL1_3 from the corresponding memory banks MB11 to MB15. In response to the assertions of the control signal pair EN and ENB, the tri-state unit 340A electrically isolates the global bit line GBL1_3 from the latch 360. In response to the assertions of the control signal pair EN and ENB, the latch 360 latches the state signal L_SIG which has the logical low value. In response to the assertions of the control signal pair EN and ENB, the n-type transistor $XU_{31}$ and the p-type transistor $XD_{32}$ are conducting. Further during the second pre-charge phase, the p-type transistor $XU_{32}$ is conducting in response to the logical low value of the state signal L_SIG. Because of the n-type transistor $XU_{31}$ between the higher power supply node VDD and the global bit line GBL1_3, at time $T_{414}$, the global bit line GBL1_3 is pre-charged to a second intermediate level VDD-Vtn, where Vtn is a threshold voltage of the n-type transistor $XU_{31}$.

During the second pre-charge phase, the global bit line GBL1_3 transitions from the low logical value to the second intermediate level VDD-Vtn at time $T_{414}$. The transition at time $T_{414}$ does not dominate a duration of a cycle time during which the multi-bank memory 10 (shown in FIG. 1) enters a reset state. Analysis of the transition of the global bit line GBL1_3 during the second pre-charge phase of FIG. 4A apply to all of the pre-charge phases described in the present disclosure and is omitted to be correspondingly described in the following.

During a second clock cycle between rising edges of the clock signal CLK at time $T_{416}$ and time $T_{430}$, a read 1 operation is performed. At time $T_{418}$, the data signal D11_SIG transitions to the logical high value.

Between time $T_{420}$ and time $T_{426}$, bank selection causes assertions of the bank enable signal pair BNK11_EN and BNK11_ENB and dassertions of other bank enable signal pairs which are the bank enable signal pair BNK12_EN and BNK12_ENB to the bank enable signal pair BNK15_EN and BNK15_ENB. During the assertions of the bank enable signal pair BNK11_EN and BNK11_ENB, the control signal pair EN and ENB deasserts. As a result, a second output generation phase of the global IO block GIO1_3A occurs between time $T_{420}$ and time $T_{426}$. In response to the assertions of the bank enable signal pair BNK11_EN and BNK11_ENB of the bank enable signal pair BNK11_EN and BNK11_ENB to the bank enable signal pair BNK15_EN and BNK15_ENB, a corresponding tri-state unit TS11_3A of the tri-state units TS11_3A to TS15_3A allows the data signal D11_SIG resulted from a corresponding memory bank (e.g. MB11 shown in FIG. 1) of the memory banks MB11 to MB51 to be non-invertedly passed to the global bit line GBL1_3. In response to the deassertions of the control signal pair EN and ENB, the n-type transistor $XU_{31}$ and the p-type transistor $XD_{32}$ are cut off. Therefore, the global bit line GBL1_3 transitions to the logical high value at time $T_{422}$ based on the data signal D11_SIG at time $T_{420}$. In response to the deassertions of the control signal pair EN and ENB, the tri-state unit 340A electrically couples the global bit line GBL1_3 to the latch 360. Therefore, at time $T_{424}$, the state signal L_SIG non-inverting with respect to the data signal D11_SIG transitions to the logical high value. At time $T_{424}$, the output signal Q transitions to the logical high value.

Compared to the other approaches, the global bit line GBL1_3 is pre-charged to the second intermediate level VDD-Vtn during the second pre-charge phase. Therefore, a transition time of the global bit line GBL1_3 from the second intermediate level VDD-Vtn to the logical high value during the second output generation phase is faster than a transition time of a full swing transition of the other approaches. Because of the faster transition time of the global bit line GBL1_3, a clock to Q delay from the rising edge of the clock signal CLK at time $T_{416}$ to the transition of the output signal Q at time $T_{424}$ is decreased compared to the other approaches.

A portion of a third pre-charge phase occurs between time $T_{426}$ and time $T_{430}$ in the second clock cycle. The bank enable signal pair BNK11_EN and BNK11_ENB to the bank enable signal pair BNK15_EN and BNK15_ENB and the control signal EN and ENB during the portion of the third pre-charge phase are the same as those during a portion of the second pre-charge phase between time $T_{412}$ and time $T_{416}$. The bank enable signal pair BNK11_EN and BNK11_ENB to the bank enable signal pair BNK15_EN and BNK15_ENB and the control signal EN and ENB during another portion of the third pre-charge phase the same as a portion of the second pre-charge phase between time $T_{416}$ and time $T_{420}$ are not shown. In response to the deassertions of all of the bank enable signal pair BNK11_EN and BNK11_ENB to the bank enable signal pair BNK15_EN and BNK15_ENB, the tri-state units TS11_3A to TS15_3A electrically isolate the global bit line GBL1_3 from the corresponding memory banks MB11 to MB15. In response to the assertions of the control signal pair EN and ENB, the tri-state unit 340A electrically isolates the global bit line GBL1_3 from the latch 360. In response to the assertions of the control signal pair EN and ENB, the latch 360 latches the state signal L_SIG which has the logical high value. In response to the assertions of the control signal pair EN and ENB, the n-type transistor $XU_{31}$ and the p-type transistor $XD_{32}$ are conducting. Further during the third pre-charge phase, the n-type transistor $XD_{31}$ is conducting in response to the logical high value of the state signal L_SIG. Because of the p-type transistor $XD_{32}$ between the global bit line GBL1_3 and the lower power supply node GND, at time $T_{428}$, the global bit line GBL1_3 is pre-charged to the first intermediate level Vtp, where Vtp is a threshold voltage of the p-type transistor $XD_{32}$.

Analysis of comparing the timing diagram 40A of the read 0 operation and the read 1 operation of the present disclosure to that of the other approaches applies to all timing diagrams labeled with "A" in the present disclosure and is omitted to be correspondingly described in the following.

Figure 4B:
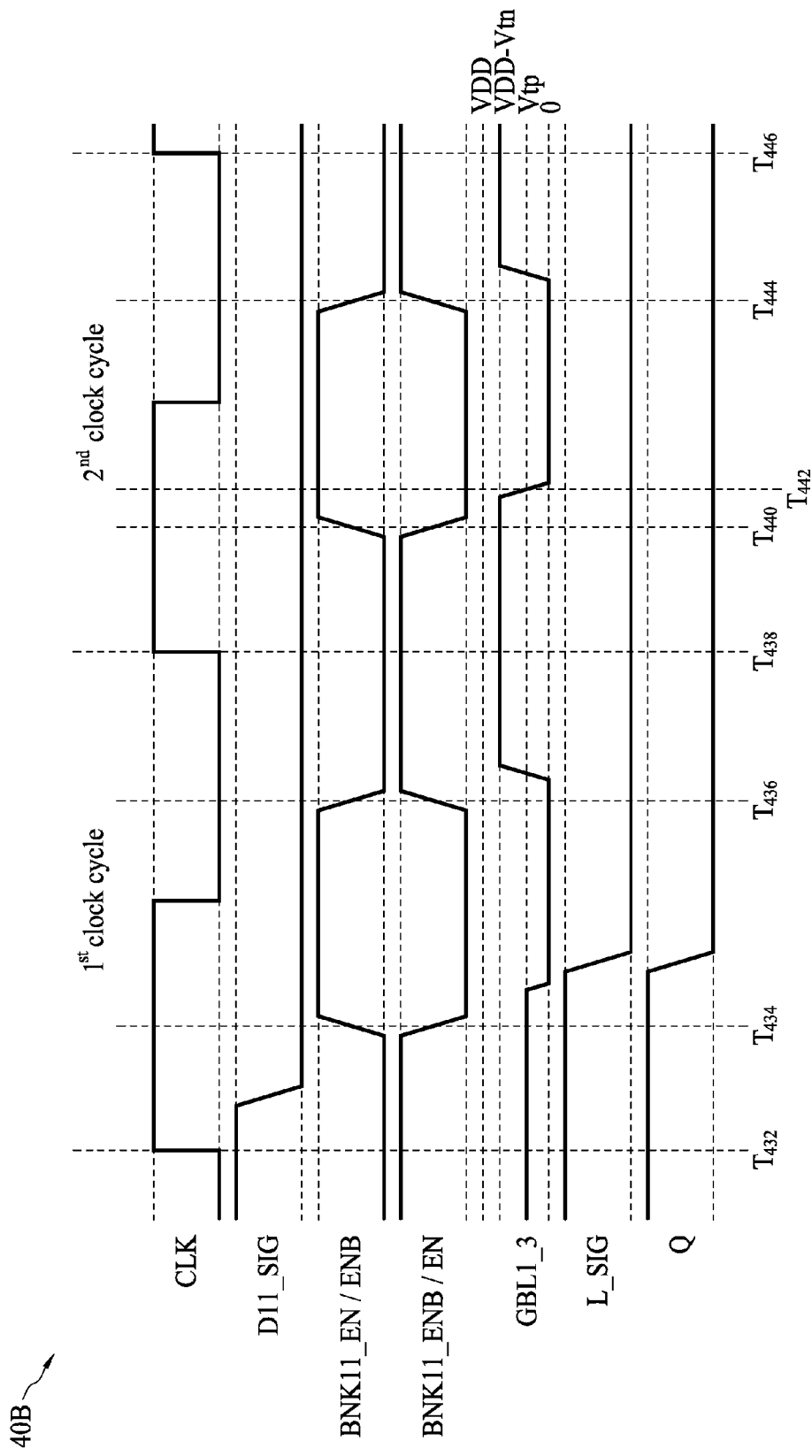
FIG. 4B is a timing diagram for a read 0 operation and a read 0 operation of the exemplary portion in FIG. 3A, in accordance with some embodiments.

FIG. 4B is a timing diagram 40B for a read 0 operation and a read 0 operation of the exemplary portion 30A in FIG. 3A, in accordance with some embodiments. Referring to FIG. 4B, for each read operation, pre-charging the global bit line GBL1_3 to an intermediate level self-adjusted based on the state signal L_SIG is performed and generating the output signal Q based on the data signal D11_SIG passed to the global bit line GBL1_3 is performed.

Referring to FIG. 4B, during a first clock cycle between rising edges of the clock signal CLK at time $T_{432}$ and time $T_{438}$, a read 0 operation is performed. A portion of a first pre-charge phase between time $T_{432}$ and time $T_{434}$ in FIG. 4B has the same signal values as the portion of the first pre-charge phase between time $T_{402}$ and time $T_{406}$ in FIG. 4A. A first output generation phase between time $T_{434}$ and time $T_{436}$ in FIG. 4B has the same signal values as the first output generation phase between time $T_{406}$ and ti $T_{412}$ in FIG. 4A. A second pre-charge phase between time $T_{436}$ and time $T_{440}$ in FIG. 4B has the same signal values as the portion of the second pre-charge phase between time $T_{412}$ and time $T_{420}$ in FIG. 4A.

During a second clock cycle between rising edges of the clock signal CLK at time $T_{438}$ and time $T_{446}$, a read 0 operation is performed.

Between time $T_{440}$ and time $T_{444}$, bank selection causes assertions of the bank enable signal pair BNK11_EN and BNK11_ENB and dassertions of other bank enable signal pairs which are the bank enable signal pair BNK12_EN and BNK12_ENB to the bank enable signal pair BNK15_EN and BNK15_ENB. During the assertions of the bank enable signal pair BNK11_EN and BNK11_ENB, the control signal pair EN and ENB deasserts. As a result, a second output generation phase of the global IO block GIO1_3A occurs between time $T_{440}$ and time $T_{444}$. In response to the assertions of the bank enable signal pair BNK11_EN and BNK11_ENB of the bank enable signal pair BNK11_EN and BNK11_ENB to the bank enable signal pair BNK15_EN and BNK15_ENB, a corresponding tri-state unit TS11_3A of the tri-state units TS11_3A to TS15_3A allows the data signal D11_SIG resulted from a corresponding memory bank (e.g. MB11 shown in FIG. 1) of the memory banks MB11 to MB51 to be non-invertedly passed to the global bit line GBL1_3. In response to the deassertions of the control signal pair EN and ENB, the n-type transistor $XU_{31}$ and the p-type transistor $XD_{32}$ are cut off. Therefore, the global bit line GBL1_3 transitions to the logical low value at time $T_{442}$ based on data signal D11_SIG at time $T_{440}$. In response to the deassertions of the control signal pair EN and ENB, the tri-state unit 340A electrically couples the global bit line GBL1_3 to the latch 360. The state signal L_SIG non-inverting with respect to the data signal D11_SIG stays at the logical low value. The output signal Q stays at the logical low value.

In the other approaches, the global bit line holds the same value latched based on the data signal D11_SIG of the first clock cycle. Based on the value of the data signal D11_SIG in the first clock cycle, the global bit line holds the logical low value initially in the second clock cycle. No transition of the global bit line occurs in the second clock cycle. In the present embodiments, the global bit line GBL1_3 is pre-charged to the second intermediate level VDD-Vtn during the second pre-charge phase and transitions to the logical low value during the second output generation phase. However, similar to the other approaches, no transition occurs in the output signal Q. Therefore, no clock to Q delay is incurred.

A portion of a third pre-charge phase between time $T_{444}$ and time $T_{446}$ in FIG. 4B has the same signal values as the portion of the second pre-charge phase between time $T_{412}$ and time $T_{416}$ in FIG. 4A.

Analysis of comparing the timing diagram 40B of the read 0 operation and the read 0 operation of the present disclosure to that of the other approaches applies to all timing diagrams labeled with "B" in the present disclosure and is omitted to be correspondingly described in the following.

Figure 5:
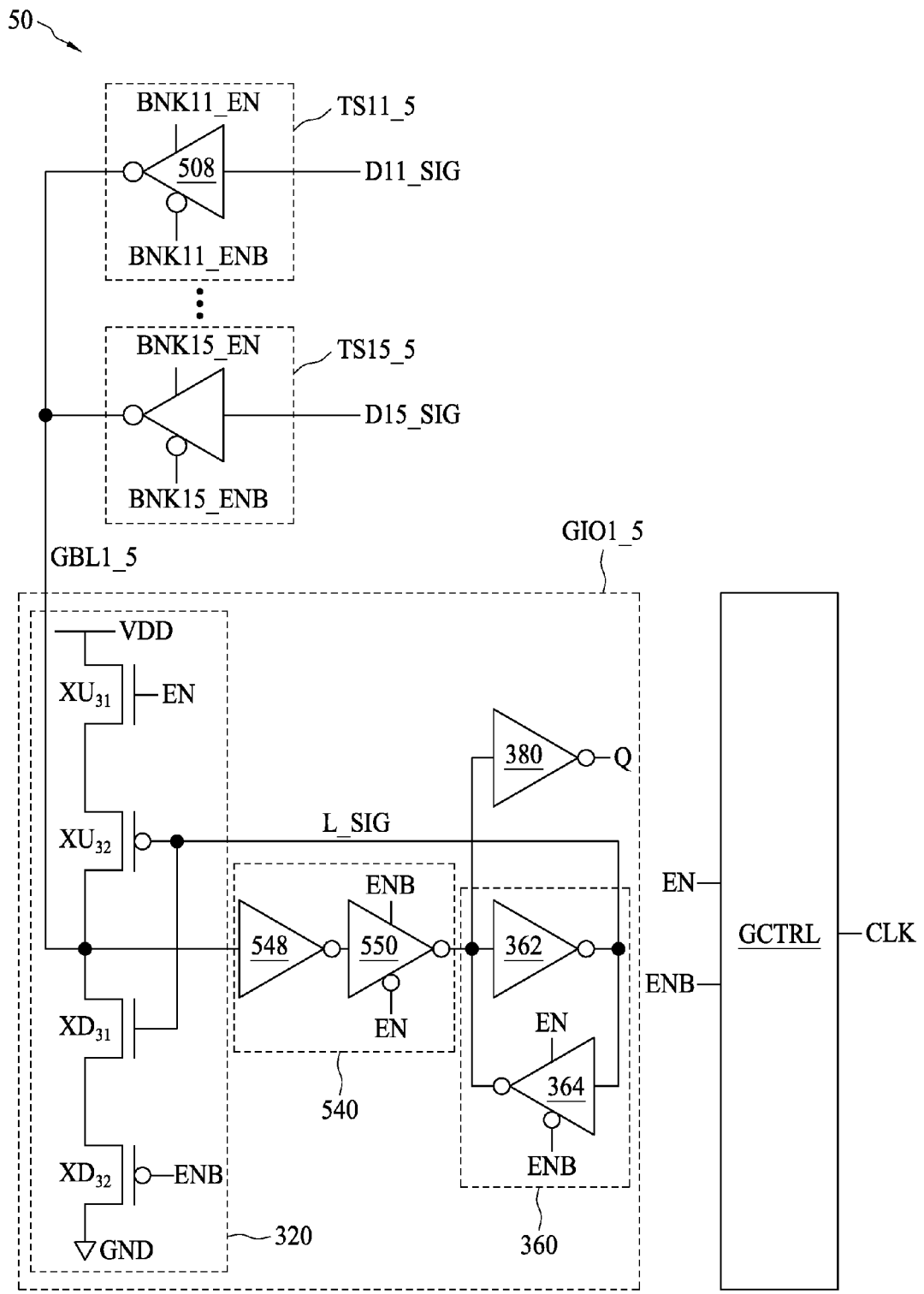
FIG. 5 is a schematic block diagram of an exemplary portion of the multi-bank memory in FIG. 1 with circuits in some of blocks shown, in accordance with some embodiments.

FIG. 5 is a schematic block diagram of an exemplary portion 50 of the multi-bank memory 10 in FIG. 1 with circuits in some of blocks shown, in accordance with some embodiments. Referring to FIG. 5, compared to the exemplary portion 30A in FIG. 3A, the exemplary portion 50 includes a plurality of tri-state units TS11_5 to TS15_5 and a tri-state unit 540. Compared to the tri-state unit TS11_3A to TS15_3A of the exemplary portion 30A, each of the tri-state units TS11_5 to TS15_5 includes a corresponding tri-state inverter 508. Compared to the tri-state unit 340A of the exemplary portion 30A, the tri-state unit 540 includes a cascaded inverter and a tri-state inverter 548 and 550. In addition, similar to the exemplary portion 30A, each of the tri-state units TS11_5 to TS15_5 is inverting with respect to the tri-state unit 540.

Referring to FIG. 5, in some embodiments, the tri-state units TS11_5 to TS15_5 correspondingly pass the data signals D11_SIG to D15_SIG to the global bit line GBL1_5 correspondingly in response to the bank enable signal pair BNK11_EN and BNK11_ENB to the bank enable signal pair BNK15_EN and BNK15_ENB. In some embodiments, each of the tri-state units TS115 to TS155 includes a corresponding tri-state inverter 508. The tri-state inverter 508 of the tri-state unit TS11_5 is described below as an example. An input of the tri-state inverter 508 receives the data signal D11_SIG. An output of the tri-state inverter 508 is electrically coupled to the global bit line GBL1_5. The tri-state inverter 508 is controlled by the bank enable signal pair BNK11_EN and BNK11_ENB. In response to assertions of the bank enable signal pair BNK11_EN and BNK11_ENB, the tri-state inverter 508 acts as an inverter. In response to deassertions of the bank enable signal pair BNK11_EN and BNK11_ENB, the tri-state inverter 508 is in a high impedance state. Therefore, in response to assertions of one bank enable signal pair (e.g. BNK11_EN and BNK11_ENB) and deassertions of other bank enable signal pairs (e.g. the bank enable signal pair BNK12_EN and BNK12_ENB to the bank enable signal pair BNK15_EN and BNK15_ENB), the tri-state unit (e.g. TS11_5) allows the data signal (e.g. D11_SIG) resulted from the memory bank (e.g. MB11 shown in FIG. 1) to be invertedly passed to the global bit line GBL1_5. In response to deassertions of all of the bank enable signal pair BNK11_EN and BNK11_ENB to the bank enable signal pair BNK15_EN and BNK15_ENB, the tri-state units TS11_5 to TS15_5 electrically isolate the global bit line GBL1_5 from the memory banks MB11 to MB15.

In some embodiments, the tri-state unit 540 includes a cascaded inverter and tri-state inverter 548 and 550. An input of the inverter 548 is electrically coupled to the global bit line GBL1_5. An output of inverter 548 is electrically coupled to an input of the tri-state inverter 550. In response to deassertions of the control signal pair EN and ENB, the tri-state inverter 342 acts as an inverter and therefore the cascaded inverter and tri-state inverter 548 and 550 electrically couples the global bit line GBL1_5 to the latch 360. In response to assertions of the control signal pair EN and ENB, the tri-state unit 340A is in a high impedance state and therefore electrically isolates the global bit line GBL1_5 from the latch 360. The tri-state unit 540 is inverting with respect to the tri-state unit (e.g. TS11_3A). Therefore, the state signal L_SIG is non-inverting with respect to the data signal (e.g. D11_SIG).

Figure 6A:
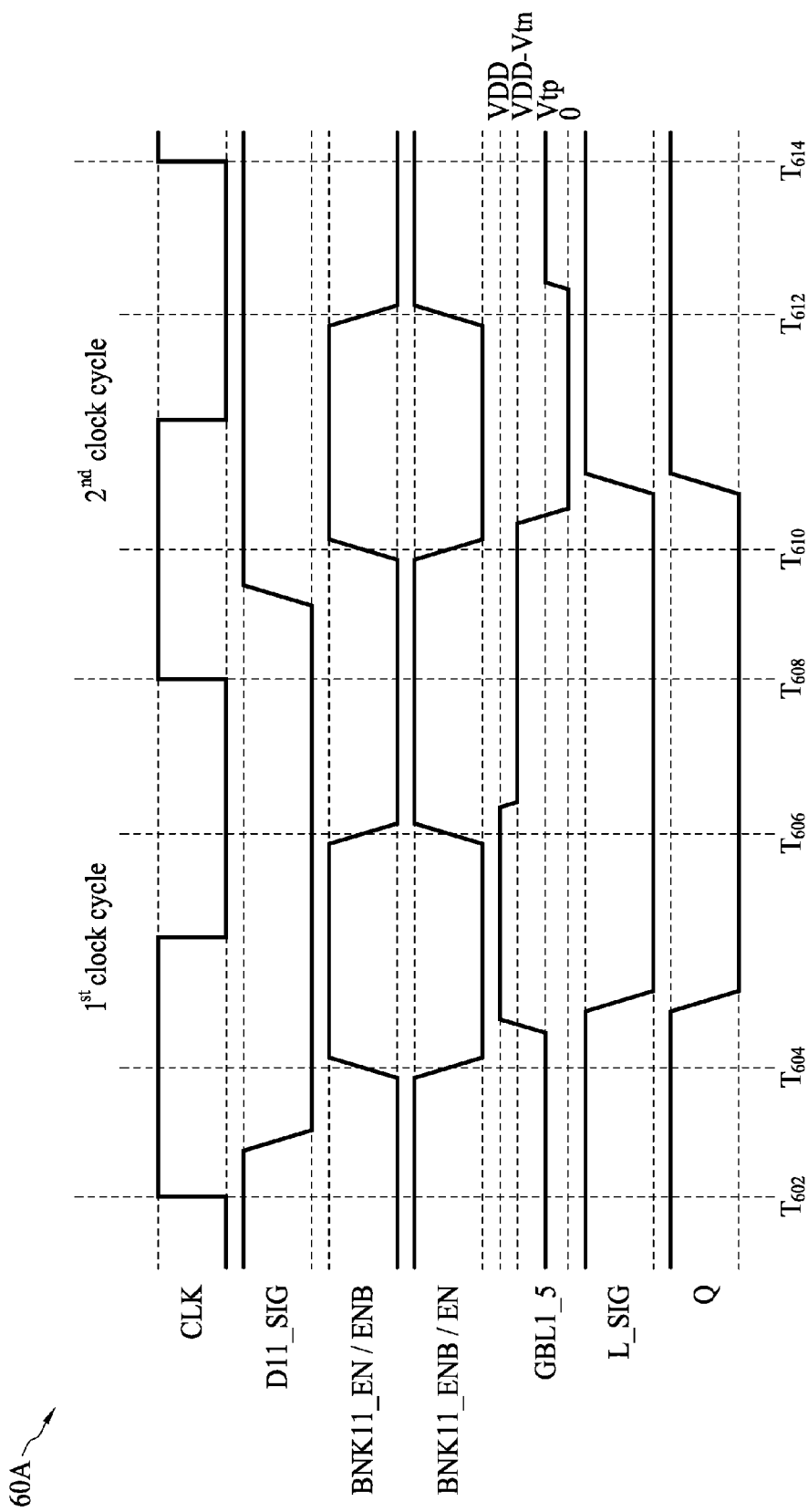
FIG. 6A is a timing diagram for a read 0 operation and a read 1 opera the exemplary portion in FIG. 5, in accordance with some embodiments.

FIG. 6A is a timing diagram 60A for a read 0 operation and a read 1 operation of the exemplary portion 50 in FIG. 5, in accordance with some embodiments. Referring to FIG. 6A, similar to the timing diagram 40A in FIG. 4A, a read 0 operation is performed during a first clock cycle between time $T_{602}$ and time $T_{608}$, and a read 1 operation is performed during a second clock cycle between time $T_{608}$ and time $T_{614}$.

Similar to the timing diagram 40A in FIG. 4A, the timing diagram 60A correspondingly has a portion of a first pre-charge phase between time $T_{602}$ and time $T_{604}$, a first output generation phase between time $T_{604}$ and time $T_{606}$, a second pre-charge phase between time $T_{606}$ and time $T_{610}$, a second output generation phase between time $T_{610}$ and time $T_{612}$, and a portion of a third pre-charge phase between time $T_{612}$ and time $T_{614}$ for the following reason. The self-adjust pre-charge unit 320 and the latch unit 360 in FIG. 5 which are labeled the same as those in FIG. 3A are controlled in the same manner as those in FIG. 3A. The tri-state units TS11_5 to TS15_5 in FIG. 5 which are inverted with respect to the tri-state units TS11_3A to TS15_3A in FIG. 3A are correspondingly controlled by the same bank enable signal pair BNK11_EN and BNK11_ENB to the bank enable signal pair BNK15_EN and BNK15_ENB. The tri-state unit 540 in FIG. 5 which is inverted with respect to the tri-state unit 340A in FIG. 3A is controlled by the same control signal pair EN and ENB.

Similar to the timing diagram 40A in FIG. 4A, the global bit line GBL1_5 in FIG. 6A is pre-charged to the same corresponding level as the global bit line GBL1_3 in FIG. 4A during each of the portion of the first pre-charge phase, the second pre-charge phase and the portion of the third pre-charge phase for the following reason. In FIG. 5, the p-type transistor $XU_{32}$ and the n-type transistor $XD_{31}$ are controlled by the state signal L_SIG. The state signal L_SIG is non-inverting with respect to the data signal D11_SIG for the state signal L_SIG is held at the output of the inverter 362 and the input of the tri-state inverter 364, and the tri-state unit 540 is inverting with respect to tri-state unit TS11_5.

Compared to the timing diagram 40A in FIG. 4A, the global bit line GBL1_5 in FIG. 6A transitions to a corresponding opposite signal value to that of the global bit line GBL1_3 in FIG. 4A during each of the first output generation phase and the second output generation phase for the following reason. The tri-state unit TS11_5 in FIG. 5 is inverting with respect to the tri-state unit TS11_3A in FIG. 3A. Similar to the timing diagram 40A in FIG. 4A, the state signal L_SIG in FIG. 6A transitions to a corresponding same signal value as the state signal L_SIG in FIG. 4A, and the output signal Q in FIG. 6A transitions to a corresponding same signal value as the output signal in FIG. 4A during each of the first output generation phase and the second output generation phase for the following reason. The tri-state unit 540 is inverting with respect to the tri-state unit TS11_5 in FIG. 5 as the tri-state unit 340A is inverting with respect to the tri-state unit TS11_3A in FIG. 3A.

Figure 6B:
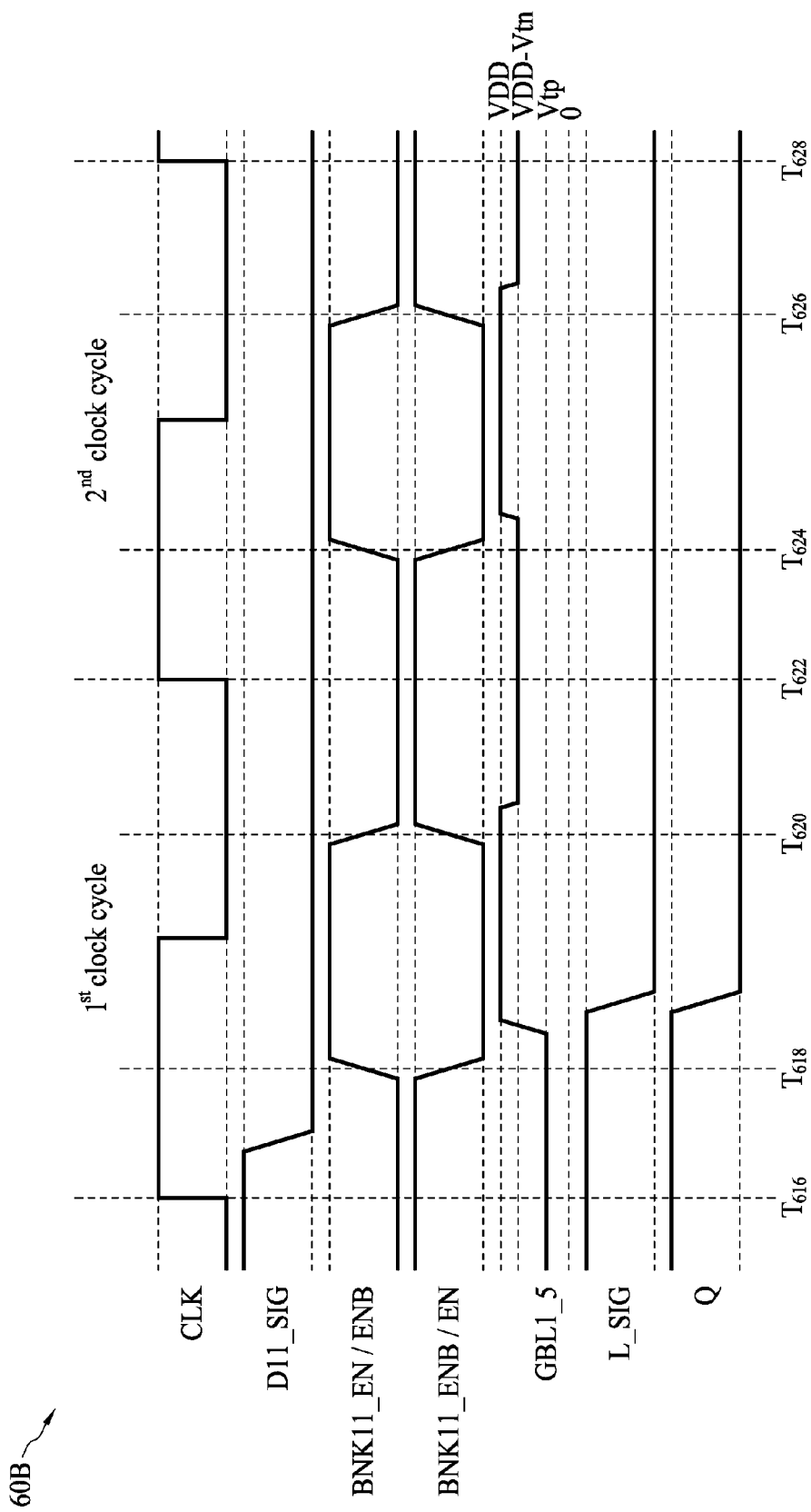
FIG. 6B is a timing diagram for a read 0 operation and a read 0 operation of the exemplary portion in FIG. 5, in accordance with some embodiments.

FIG. 6B is a timing diagram 60B for a read 0 operation and a read 0 operation of the exemplary portion 50 in FIG. 5, in accordance with some embodiments. Referring to FIG. 6B, similar to the timing diagram 40B in FIG. 4B, a read 0 operation is performed during a first clock cycle between time $T_{616}$ and tune $T_{622}$, and a read 0 operation is performed during a second clock cycle between time $T_{622}$ and time $T_{628}$.

Similar to the timing diagram 40B in FIG. 4B, the timing diagram 60B correspondingly has a portion of a first pre-charge phase between time $T_{616}$ and time $T_{618}$, a first output generation phase between time $T_{618}$ and time $T_{620}$, a second pre-charge phase between time $T_{620}$ and time $T_{624}$, a second output generation phase between time $T_{624}$ and time $T_{626}$, and a portion of a third pre-charge phase between time $T_{626}$ and time $T_{628}$ for the following reason. The self-adjust pre-charge unit 320 and the latch unit 360 in FIG. 5 which are labeled the same as those in FIG. 3A are controlled in the same manner as those in FIG. 3A. The tri-state units TS11_5 to TS15_5 in FIG. 5 which are inverted with respect to the tri-state units TS11_3A to TS15_3A in FIG. 3A are correspondingly controlled by the same bank enable signal pair BNK11_EN and BNK11_ENB to the bank enable signal pair BNK15_EN and BNK15_ENB. The tri-state unit 540 in FIG. 5 which is inverted with respect to the tri-state unit 340A in FIG. 3A is controlled by the same control signal pair EN and ENB.

Similar to the timing diagram 40B in FIG. 4B, the global bit line GBL1_5 in FIG. 6B is pre-charged to the same corresponding level as the global bit line GBL1_3 in FIG. 4B during each of the portion of the first pre-charge phase, the second pre-charge phase and the portion of the third pre-charge phase for the following reason. In FIG. 5, the p-type transistor $XU_{32}$ and the n-type transistor $XD_{31}$ are controlled by the state signal L_SIG. The state signal L_SIG is non-inverting with respect to the data signal D11_SIG for the state signal L_SIG is held at the output of the inverter 362 and the input of the tri-state inverter 364, and the tri-state unit 540 is inverting with respect to the tri-state unit TS11_5.

Compared to the timing diagram 40B in FIG. 4B, the global bit line GBL1_5 in FIG. 6B transitions to a corresponding opposite signal value to that of the global bit line GBL1_3 in FIG. 4B during each of the first output generation phase and the second output generation phase for the following reason. The tri-state unit TS11_5 in FIG. 5 is inverting with respect to the tri-state unit TS11_3A in FIG. 3A. Similar to the tuning diagram 40B in FIG. 4B, the state signal L_SIG in FIG. 6B transitions to a corresponding same signal value as the state signal L_SIG in FIG. 4B, and the output signal Q in FIG. 6B transitions to a corresponding same signal value as the output signal in FIG. 4B during each of the first output generation phase and the second output generation phase for the following reason. The tri-state unit 540 is inverting with respect to the tri-state unit TS11_5 in FIG. 5 as the tri-state unit 340A is inverting with respect to the tri-state unit TS11_3A in FIG. 3A.

Figure 7:
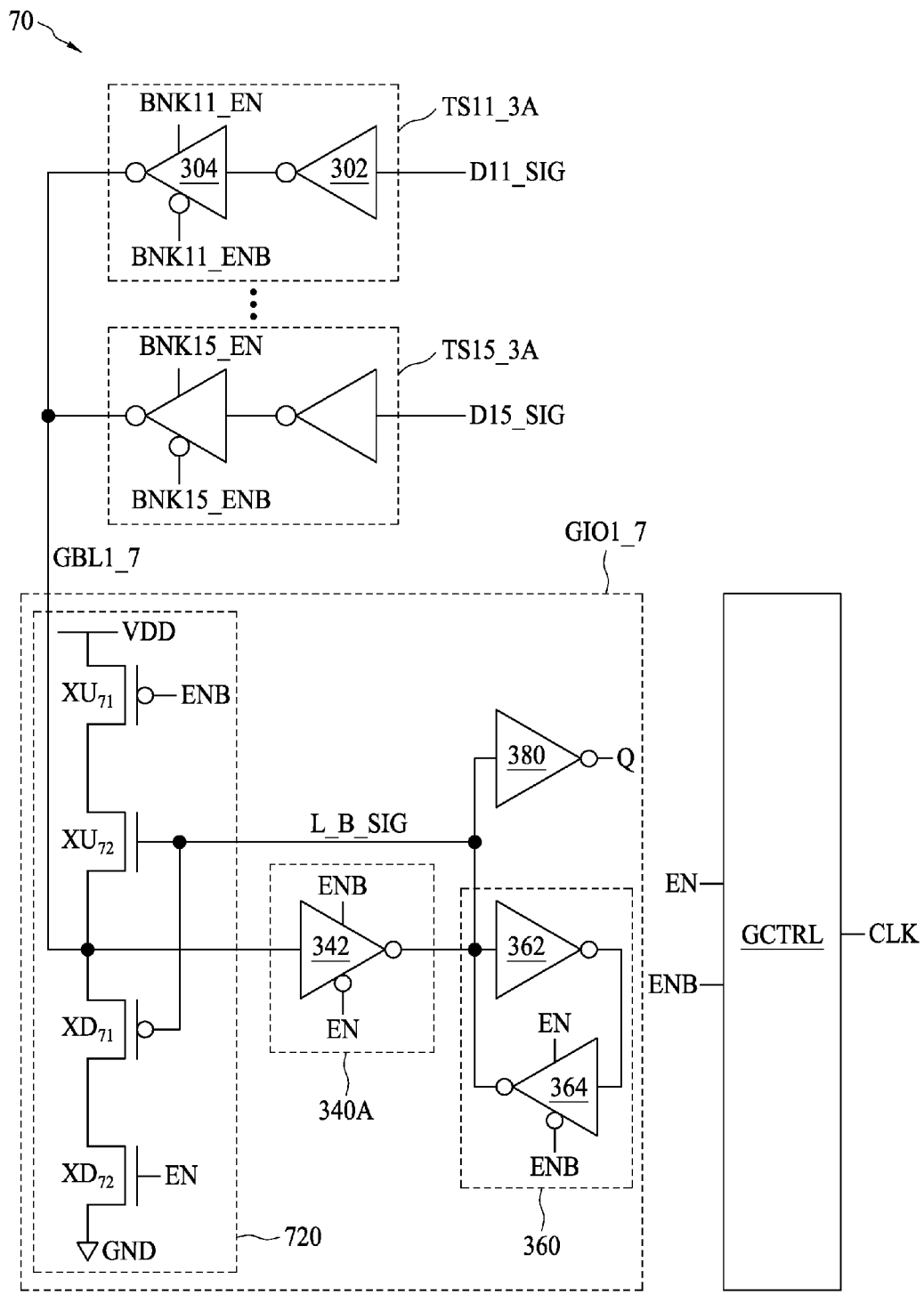
FIG. 7 is a schematic block diagram of an exemplary portion of the multi-bank memory in FIG. 1 with circuits in some of blocks shown, in accordance with some embodiments.

FIG. 7 is a schematic block diagram of an exemplary portion 70 of the multi-bank memory 10 in FIG. 1 with circuits in some of blocks shown, in accordance with some embodiments. Referring to FIG. 7, compared to the exemplary portion 30A in FIG. 3A, the exemplary portion 70 includes a self-adjust pre-charge unit 720 with a p-type transistor $XU_{71}$ and an n-type transistor $XU_{72}$ electrically coupled between a higher power supply node VDD and a global bit line GBL1_7, and a p-type transistor $XD_{71}$ and an n-type transistor $XD_{72}$ electrically coupled between the global bit line GBL1_7 and a lower power supply node GND. Compared to the n-type transistor $XU_{31}$ and the p-type transistor $XU_{32}$ in the exemplary portion 30A, the corresponding p-type transistor $XU_{71}$ and the n-type transistor $XU_{72}$ are of opposite conductivity types. Further compared to the n-type transistor $XU_{31}$ and the p-type transistor $XU_{32}$ of the exemplary portion 30A, the corresponding p-type transistor $XU_{71}$ and the n-type transistor $XU_{72}$ are correspondingly controlled by a control signal ENB inverted with respect to the control signal EN and a state signal L_B_SIG inverted with respect to the state signal L_SIG. Compared to the n-type transistor $XD_{31}$ and the p-type transistor $XD_{32}$ of the exemplary portion 30A, the corresponding p-type transistor $XD_{71}$ and the n-type transistor $XD_{72}$ are of opposite conductivity types. Further compared to the n-type transistor $XD_{31}$ and the p-type transistor $XD_{32}$ of the exemplary portion 30A, the corresponding p-type transistor $XD_{71}$ and the n-type transistor $XD_{72}$ are correspondingly controlled by the state signal L_B_SIG inverted with respect to the state signal L_SIG and a control signal EN inverted with respect to the control signal ENB.

In some embodiments, the self-adjust pre-charge unit 720 includes a higher power supply node VDD and a lower power supply node GND, a p-type transistor $XU_{71}$, an n-type transistor $XU_{72}$, a p-type transistor $XD_{71}$ and an n-type transistor $XD_{72}$. The p-type transistor $XU_{71}$ and the n-type transistor $XU_{72}$ are electrically coupled in series between the higher power supply node VDD and the global bit line GBL1_7. The p-type transistor $XU_{71}$ is controlled by a control signal ENB of a control signal pair EN and ENB. The n-type transistor $XU_{72}$ is controlled by a state signal L_B_SIG. The state signal L_B_SIG is held by the latch 360 at the input of the inverter 362 and the output of the tri-state inverter 364. The p-type transistor $XD_{71}$ and the n-type transistor $XD_{72}$ are electrically coupled in series between the global bit line GBL1_7 and the lower power supply node GND. The p-type transistor $XD_{71}$ is controlled by the state signal L_B_SIG. The n-type transistor $XD_{72}$ is controlled by a control signal EN of the control signal pair EN and ENB.

In response to the assertions of the control signal pair EN and ENB, the p-type transistor $XU_{71}$ and the n-type transistor $XD_{72}$ are conducting. Further in response to the state signal L_B_SIG, one of the n-type transistor $XU_{72}$ and the p-type transistor $XD_{71}$ is conducting. In response to the deassertions of the control signal pair EN and ENB, the p-type transistor $XU_{71}$ and the n-type transistor $XD_{72}$ are cut off.

Figure 8A:
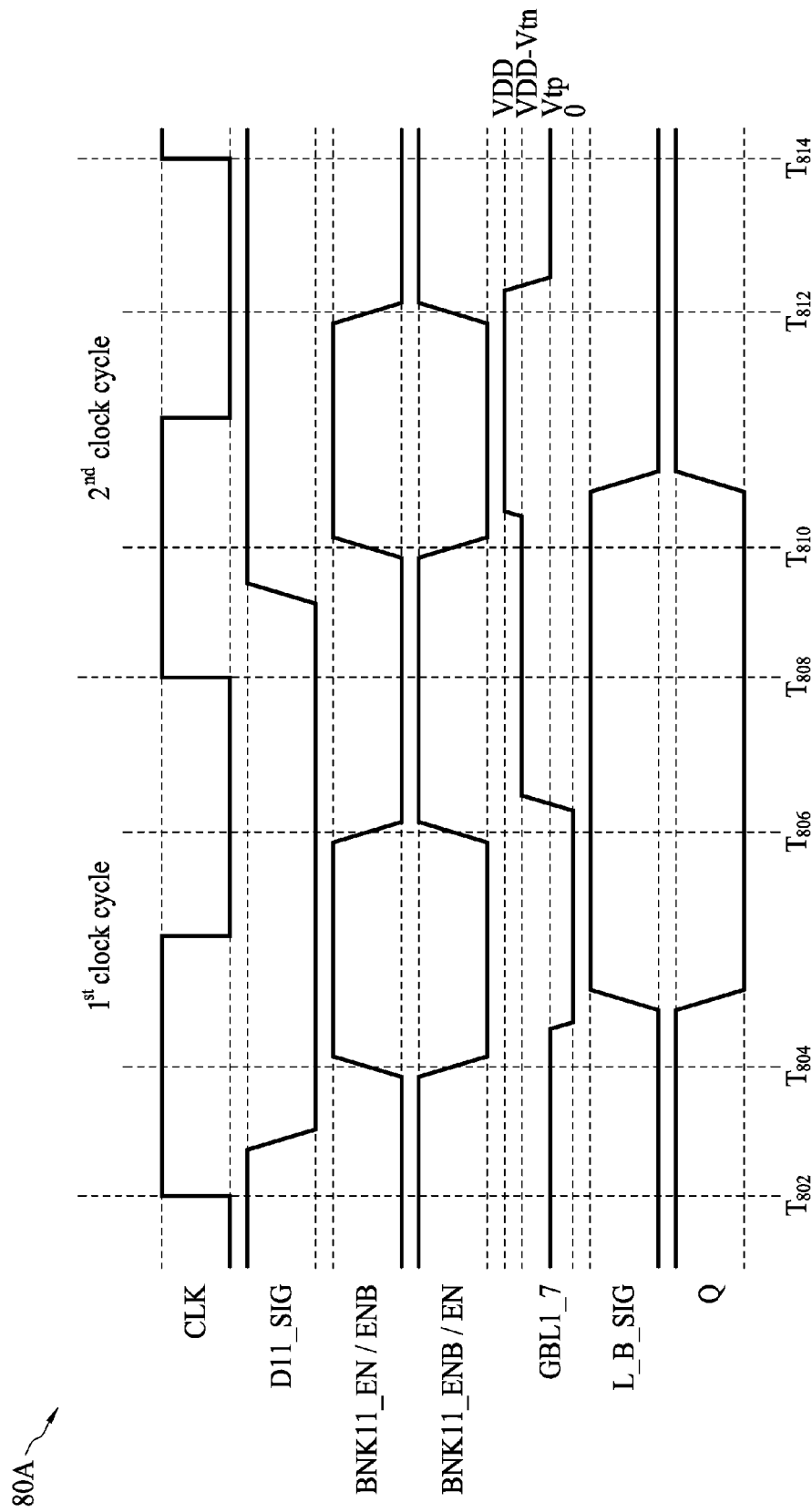
FIG. 8A is a timing diagram for a read 0 operation and a read 1 operation of the exemplary portion in FIG. 7, in accordance with some embodiments.

FIG. 8A is a timing diagram 80A for a read 0 operation and a read 1 operation of the exemplary portion 70 in FIG. 7, in accordance with some embodiments. Referring to FIG. 8A, similar to the timing diagram 40A in FIG. 4A, a read 0 operation is performed during a first clock cycle between time $T_{802}$ and time $T_{808}$, and a read 1 operation is performed during a second clock cycle between time $T_{808}$ and time $T_{814}$.

Similar to the timing diagram 40A in FIG. 4A, the timing diagram 80A correspondingly has a portion of a first pre-charge phase between time $T_{802}$ and time $T_{804}$, a first output generation phase between time $T_{804}$ and time $T_{806}$, a second pre-charge phase between time $T_{806}$ and time $T_{810}$, a second output generation phase between time $T_{810}$ and time $T_{812}$, and a portion of a third pre-charge phase between time $T_{812}$ and time $T_{814}$ for the following reason. The tri-state units TS11_3A to TS15_3A, the tri-state unit 340A, the latch 360 in FIG. 7 which are labeled the same as those in FIG. 3A are controlled in the same manner as those in FIG. 3A. The FET $XU_{71}$ in FIG. 7 and the FET $XU_{31}$ in FIG. 3A are of opposite conductivity types, and are correspondingly controlled by control signals ENB and EN inverted with respect to each other. The FET $XD_{72}$ in FIG. 7 and the FET $XD_{32}$ in FIG. 3A are of opposite conductivity types, and are correspondingly controlled by control signals EN and ENB inverted with respect to each other.

Similar to the timing diagram 40A in FIG. 4A, the global bit line GBL1_7 in FIG. 8A has a corresponding same signal value as the global bit line GBL1_3 in FIG. 4A during each of the portion of the first pre-charge phase, the second pre-charge phase and the portion of the third pre-charge phase for the following reason. The FET $XU_{72}$ in FIG. 7 and the FET $XU_{32}$ in FIG. 3A are of opposite conductivity types, and are correspondingly controlled by the state signals L_B_SIG and L_SIG inverted with respect to each other. The FET $XU_{71}$ in FIG. 7 and the FET $XU_{31}$ in FIG. 3A are of opposite conductivity types, and are correspondingly controlled by the state signals L_B_SIG and L_SIG inverted with respect to each other. Furthermore, because of the p-type transistor $XD_{71}$ between the global bit line GBL1_7 and the lower power supply node GND, during the portion of the first pre-charge phase and the portion of the third pre-charge phase, the global bit line GBL1_7 is pre-charged to the first intermediate level Vtp, where Vtp is a threshold voltage of the p-type transistor $XD_{71}$. Because of the n-type transistor $XU_{72}$ between the higher power supply node VDD and the global bit line GBL1_7, during the second pre-charge phase, the global bit line GBL1_7 is pre-charged to the second intermediate level VDD-Vtn, where Vtn is a threshold voltage of the n-type transistor $XU_{72}$.

Similar to the timing diagram 40A in FIG. 4A, the global bit line GBL1_7 in FIG. 8A has a corresponding same signal value as the global bit line GBL1_3 in FIG. 4A, and the output signal Q in FIG. 8A has a corresponding same signal value as the output signal Q in FIG. 4A during each of the first output generation phase and the second output generation phase for the following reason. The data signal D11_SIG in FIG. 8A has the same signal values as the data signal D11_SIG in FIG. 4A. The tri-state units TS11_3A to TS15_3A, the tri-state unit 340A, the latch 360 and the inverter 380 in FIG. 7 which are labeled the same as those in FIG. 3A function in the same manner as those in FIG. 3A. Compared to the timing diagram 40A in FIG. 4A, the state signal L_B_SIG in FIG. 8A has a corresponding opposite signal value to that of the state signal L_SIG in FIG. 4A during each of the first output generation phase and the second output generation phase for the following reason. The state signal L_B_SIG in FIG. 7 is held at the input of the inverter 362 and the output of the tri-state inverter 364 and the state signal L_SIG in FIG. 3A is held at the output of the inverter 362 and the input of the tri-state inverter 364.

Figure 8B:
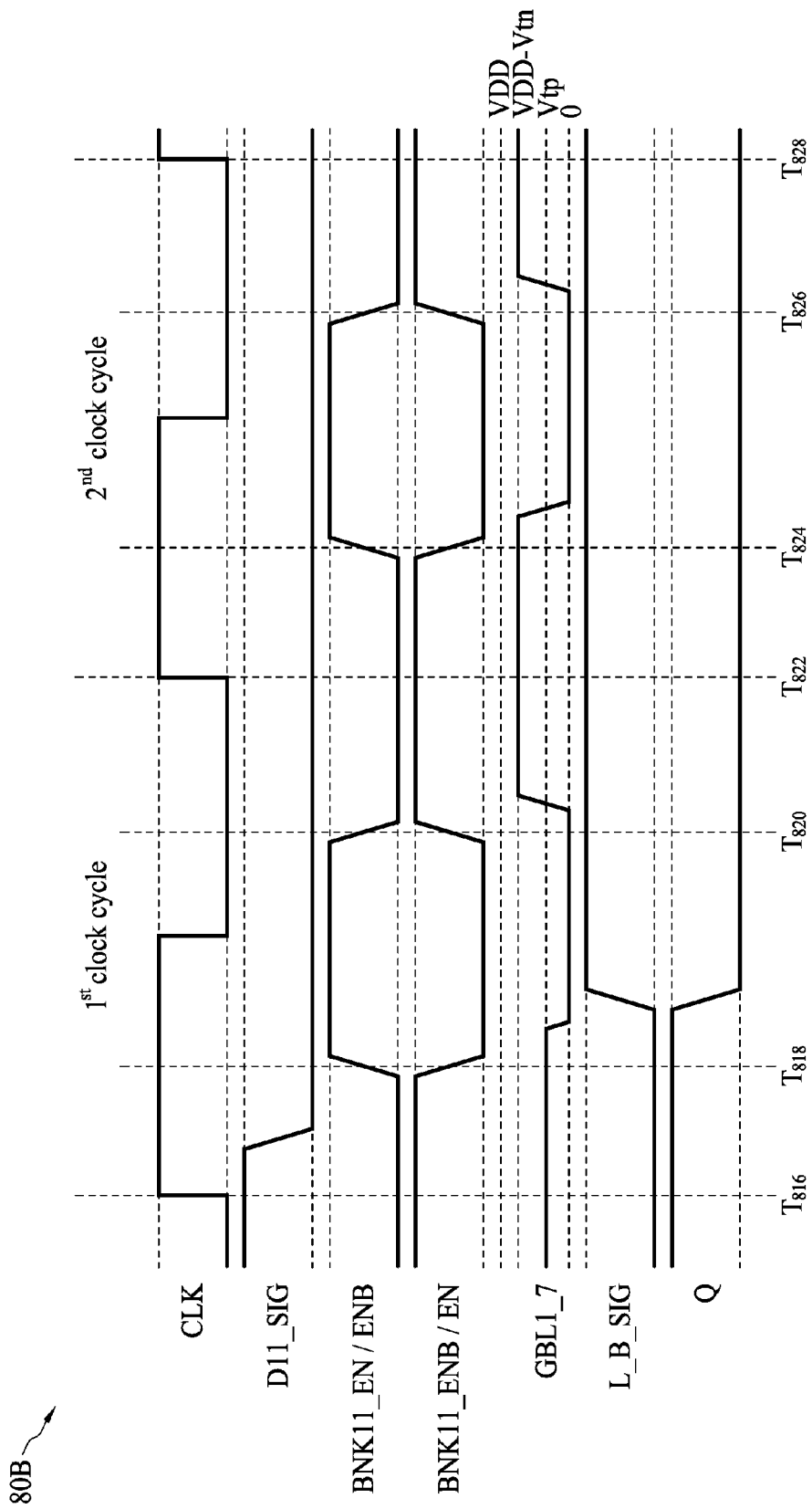
FIG. 8B is a timing diagram for a read 0 operation and a read 0 operation of the exemplary portion in FIG. 7, in accordance with some embodiments.

FIG. 8B is a timing diagram 80B for a read 0 operation and a read 0 operation of the exemplary portion 70 in FIG. 7, in accordance with some embodiments. Referring to FIG. 8B, similar to the tuning diagram 40B in FIG. 4B, a read 0 operation is performed during a first clock cycle between time $T_{816}$ and time $T_{822}$, and a read 0 operation is performed during a second clock cycle between time $T_{822}$ and time $T_{828}$.

Similar to the timing diagram 40B in FIG. 4B, the timing diagram 80B correspondingly has a portion of a first pre-charge phase between time $T_{816}$ and time $T_{818}$, a first output generation phase between time $T_{818}$ and time $T_{820}$, a second pre-charge phase between time $T_{820}$ and time $T_{824}$, a second output generation phase between time $T_{824}$ and time $T_{826}$, and a portion of a third pre-charge phase between time $T_{826}$ and time $T_{828}$ for the following reason. The tri-state units TS11_3A to TS15_3A, the tri-state unit 340A, the latch 360 in FIG. 7 which are labeled the same as those in FIG. 3A are controlled in the same manner as those in FIG. 3A. The FET $XU_{71}$ in FIG. 7 and the FET $XU_{31}$ in FIG. 3A are of opposite conductivity types, and are correspondingly controlled by control signals ENB and EN inverted with respect to each other. The FET $XU_{72}$ in FIG. 7 and the FET $XU_{32}$ in FIG. 3A are of opposite conductivity types, and are correspondingly controlled by control signals EN and ENB inverted with respect to each other.

Similar to the timing diagram 409 in FIG. 4B, the global bit line GBL1_7 in FIG. 8B has a corresponding same signal value as the global bit line GBL1_3 in FIG. 4B during each of the portion of the first pre-charge phase, the second pre-charge phase and the portion of the third pre-charge phase for the following reason. The FET $XU_{72}$ in FIG. 7 and the FET $XU_{32}$ in FIG. 3A are of opposite conductivity types, and are correspondingly controlled by the state signals L_B_SIG and L_SIG inverted with respect to each other. The FET $XD_{71}$ in FIG. 7 and the FET $XD_{31}$ in FIG. 3A are of opposite conductivity types, and are correspondingly controlled by the state signals L_B_SIG and L_SIG inverted with respect to each other. Furthermore, because of the p-type transistor $XD_{71}$ between the global bit line GBL1_7 and the lower power supply node GND, during the portion of the first pre-charge phase, the global bit line GBL1_7 is pre-charged to the first intermediate level Vtp, where Vtp is a threshold voltage of the p-type transistor $XD_{71}$. Because of the n-type transistor $XU_{72}$ between the higher power supply node VDD and the global bit line GBL1_7, during the second pre-charge phase and the portion of the third pre-charge phase, the global bit line GBL1_7 is pre-charged to the second intermediate level VDD-Vtn, where Vtn is a threshold voltage of the n-type transistor $XU_{72}$.

Similar to the timing diagram 40B in FIG. 4B, the global bit line GBL1_7 in FIG. 8B has a corresponding same signal value as the global bit line GBL1_3 in FIG. 4B, and the output signal Q in FIG. 8A has a corresponding same signal value as the output signal Q in FIG. 4B during each of the first output generation phase and the second output generation phase for the following reason. The data signal D11_SIG in FIG. 8B has the same signal values as the data signal D11_SIG in FIG. 4A. The tri-state units TS11_3A to TS15_3A, the tri-state unit 340A, the latch 360 and the inverter 380 in FIG. 7 which are labeled the same as those in FIG. 3A function in the same manner as those in FIG. 3A. Compared to the timing diagram 409 in FIG. 4B, the state signal L_B_SIG in FIG. 8B has a corresponding opposite signal value to that of the state signal L_SIG in FIG. 4B during each of the first output generation phase and the second output generation phase for the following reason. The state signal L_B_SIG in FIG. 7 is held at the input of the inverter 362 and the output of the tri-state inverter 364 and the state signal L_SIG in FIG. 3A is held at the output of the inverter 362 and the input of the tri-state inverter 364.

Figure 9:
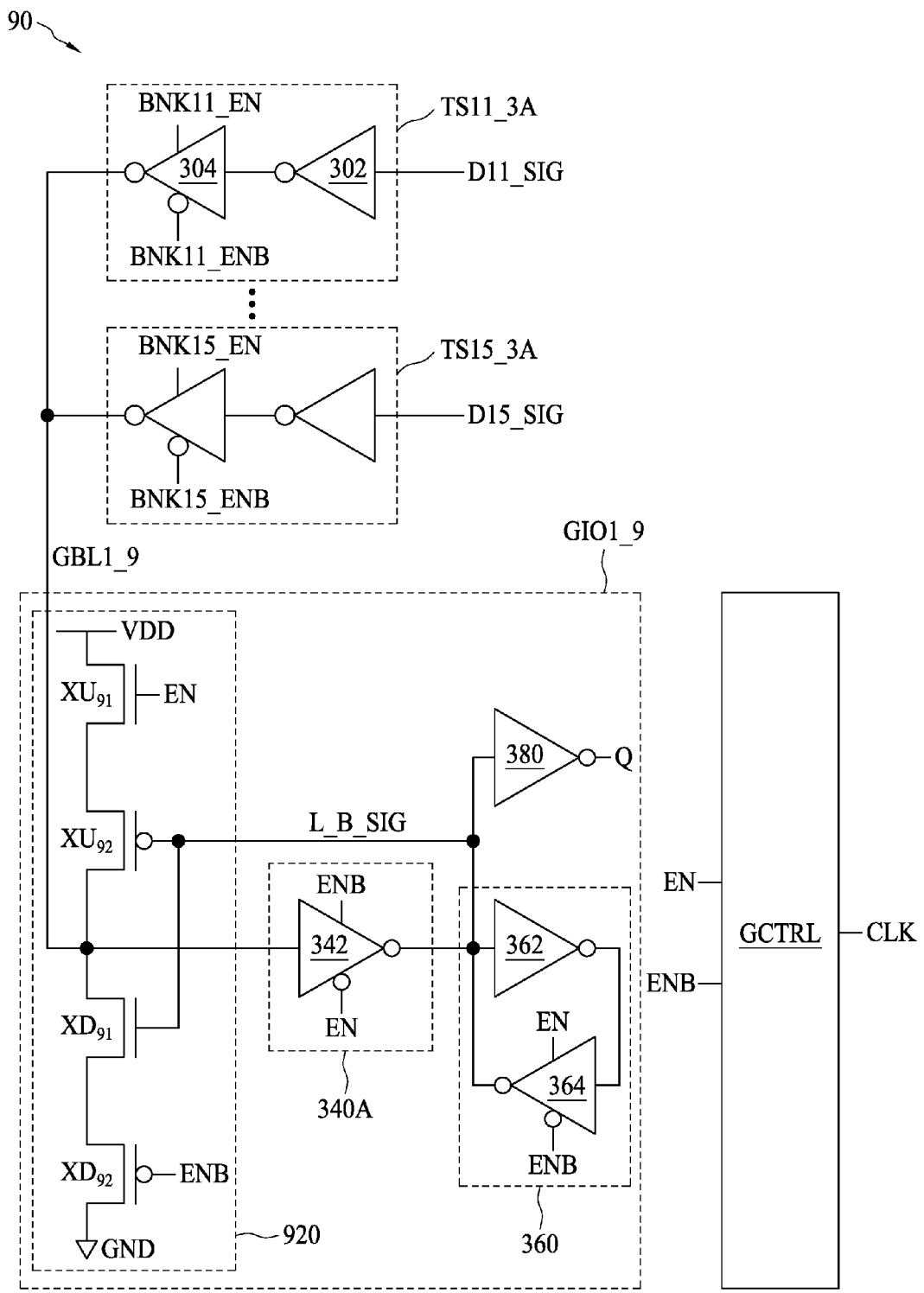
FIG. 9 is a schematic block diagram of an exemplary portion of the multi-bank memory in FIG. 1 with circuits in some of blocks shown, in accordance with some embodiments.

FIG. 9 is a schematic block diagram of an exemplary portion 90 of the multi-bank memory 10 in FIG. 1 with circuits in some of blocks shown, in accordance with some embodiments. Referring to FIG. 9, compared to the exemplary portion 30A in FIG. 3A, the exemplary portion 90 includes a self-adjust pre-charge unit 920 with an n-type transistor $XU_{91}$ and a p-type transistor $XU_{92}$ electrically coupled between a higher power supply node VDD and a global bit line GBL1_9, and an n-type transistor $XD_{91}$ and a p-type transistor $XD_{92}$ electrically coupled between global bit line GBL1_9 and a lower power supply node GND. Similar to the n-type transistor $XU_{31}$ of the exemplary portion 30A, the n-type transistor $XU_{91}$ is controlled by a control signal EN. Compared to the p-type transistor $XU_{32}$ of the exemplary portion 30A, the p-type transistor $XU_{92}$ is controlled by a state signal L_B_SIG inverted with respect to the state signal L_SIG. Compared to the n-type transistor $XD_{31}$ of the exemplary portion 30A, the p-type transistor $XD_{91}$ is controlled by the state signal L_B_SIG. Similar to the p-type transistor $XD_{32}$ of the exemplary portion 30A, the p-type transistor $XD_{92}$ is controlled by a control signal ENB.

In some embodiments, the self-adjust pre-charge unit 920 includes a higher power supply node VDD and a lower power supply node GND, an n-type transistor $XU_{91}$, a p-type transistor $XU_{92}$, an n-type transistor $XD_{91}$ and a p-type transistor $XD_{92}$. The n-type transistor $XU_{91}$ and the p-type transistor $XU_{92}$ are electrically coupled in series between the higher power supply node VDD and the global bit line GBL1_9. The n-type transistor $XU_{91}$ is controlled by a control signal EN of a control signal pair EN and ENB. The p-type transistor $XU_{92}$ is controlled by a state signal L_B_SIG. The state signal L_B_SIG is held by the latch 360 at the input of the inverter 362 and the output of the tri-state inverter 364. The n-type transistor $XD_{91}$ and the p-type transistor $XD_{92}$ are electrically coupled in series between the global bit line GBL1_9 and the lower power supply node GND. The n-type transistor $XD_{91}$ is controlled by the state signal L_B_SIG. The p-type transistor $XD_{92}$ is controlled by a control signal ENB of the control signal pair EN and ENB. In response to the assertions of the control signal pair EN and ENB, the n-type transistor $XU_{91}$ and the p-type transistor $XD_{92}$ are conducting. Further in response to the state signal L_B_SIG, one of the p-type transistor $XU_{92}$ and the n-type transistor $XD_{91}$ is conducting. In response to the deassertions of the control signal pair EN and ENB, the n-type transistor $XU_{91}$ and the p-type transistor $XD_{92}$ are cut off.

Figure 10A:
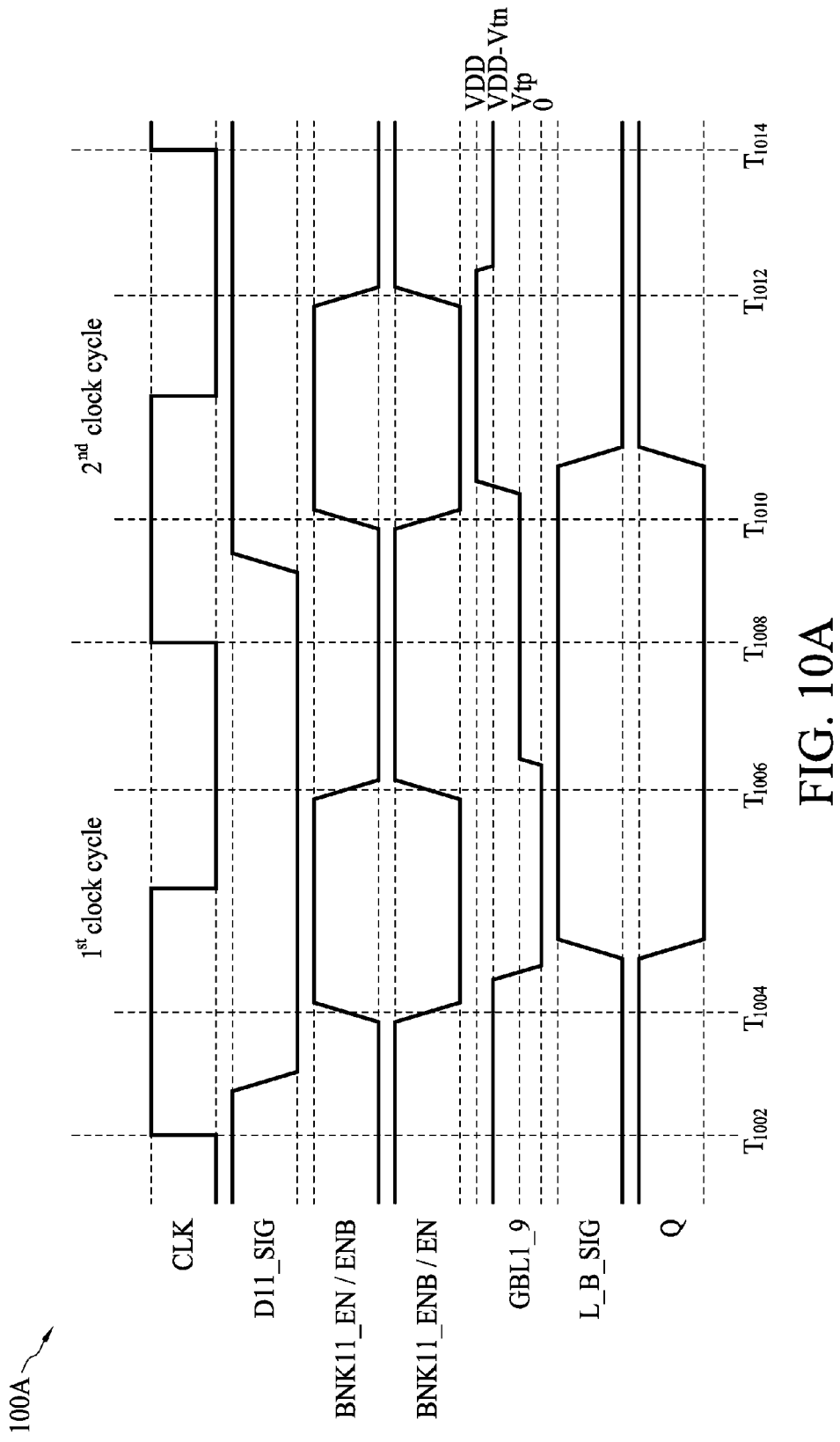
FIG. 10A is a timing diagram for a read 0 operation and a read 1 operation of the exemplary portion in FIG. 9, in accordance with some embodiments.

FIG. 10A is a timing diagram 100A for a read 0 operation and a read 1 operation of the exemplary portion 90 in FIG. 9, in accordance with some embodiments. Referring to FIG. 10A, similar to the timing diagram 40A in FIG. 4A, a read 0 operation is performed during a first clock cycle between time $T_{1002}$ and time $T_{1008}$, and a read 1 operation is performed during a second clock cycle between time $T_{1008}$ and time $T_{1014}$.

Similar to the timing diagram 40A in FIG. 4A, the timing diagram 100A correspondingly has a portion of a first pre-charge phase between time $T_{1002}$ and time $T_{1004}$, a first output generation phase between time $T_{1004}$ and time $T_{1006}$, a second pre-charge phase between time $T_{1006}$ and time $T_{1010}$, a second output generation phase between time $T_{1010}$ and time $T_{1012}$, and a portion of a third pre-charge phase between time $T_{1012}$ and time $T_{1014}$ for the following reason. The tri-state units TS11_3A to TS15_3A, the tri-state unit 340A, the latch 360 in FIG. 9 which are labeled the same as those in FIG. 3A are controlled in the same manner as those in FIG. 3A. The FET $XU_{91}$ in FIG. 9 and the FET $XU_{31}$ in FIG. 3A are of the same conductivity type, and are controlled by the same control signal EN. The FET $XD_{92}$ in FIG. 9 and the FET $XD_{32}$ in FIG. 3A are of the same conductivity type, and are correspondingly controlled by the same control signal ENB.

Compared to the timing diagram 40A in FIG. 4A, the global bit line GBL19 in FIG. 10A has a corresponding opposite signal value to that of the global bit line GBL1_3 in FIG. 4A during each of the portion of the first pre-charge phase, the second pre-charge phase and the portion of the third pre-charge phase for the following reason. The FET $XU_{92}$ in FIG. 9 and the FET $XU_{32}$ in FIG. 3A are of the same conductivity type, and are correspondingly controlled by the state signals L_B_SIG and L_SIG inverted with respect to each other. The FET $XD_{91}$ in FIG. 9 and the FET $XD_{31}$ in FIG. 3A are of the same conductivity type, and are correspondingly controlled by the state signals L_B_SIG and L_SIG inverted with respect to each other. Furthermore, because of the n-type transistor $XU_{91}$ between the higher power supply node VDD and the global bit line GBL1_9, during the portion of the first pre-charge phase and the portion of the third pre-charge phase, the global bit line GBL1_9 is pre-charged to the second intermediate level VDD-Vtn, where Vtn is a threshold voltage of the n-type transistor $XU_{91}$. Because of the p-type transistor $XD_{92}$ between the global bit line GBL1_9 and the lower power supply node GND, during the second pre-charge phase, the global bit line GBL1_9 is pre-charged to the first intermediate level Vtp, where Vtp is a threshold voltage of the p-type transistor $XD_{92}$.

Similar to the timing diagram 40A in FIG. 4A, the global bit line GBL1_9 in FIG. 10A has a corresponding same signal value as the global bit line GBL1_3 in FIG. 4A, and the output signal Q in FIG. 10A has a corresponding same signal value as the output signal Q in FIG. 4A during each of the first output generation phase and the second output generation phase for the following reason. The data signal D11_SIG in FIG. 10A has the same signal values as the data signal D11_SIG in FIG. 4A. The tri-state units TS11_3A to TS15_3A, the tri-state unit 340A, the latch 360 and the inverter 380 in FIG. 9 which are labeled the same as those in FIG. 3A function in the same manner as those in FIG. 3A. Compared to the timing diagram 40A in FIG. 4A, the state signal L_B_SIG in FIG. 10A has a corresponding opposite signal value to that of the state signal L_SIG in FIG. 4A during each of the first output generation phase and the second output generation phase for the following reason. The state signal L_B_SIG in FIG. 9 is held at the input of the inverter 362 and the output of the tri-state inverter 364 and the state signal L_SIG in FIG. 3A is held at the output of the inverter 362 and the input of the tri-state inverter 364.

Figure 10B:
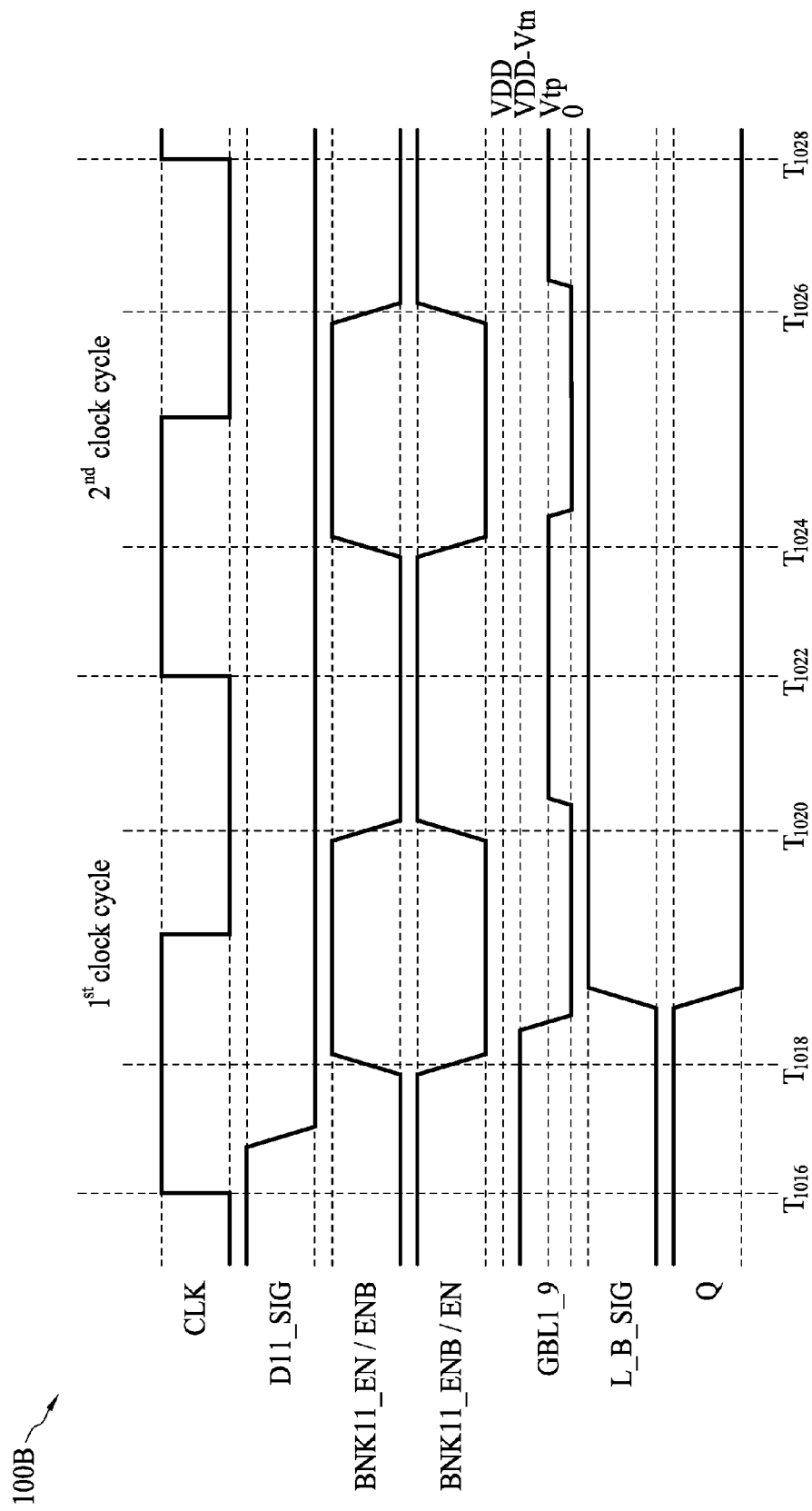
FIG. 10B is a timing diagram for a read 0 operation and a read 0 operation of the exemplary portion in FIG. 9, in accordance with some embodiments.

FIG. 10B is a timing diagram 100B for a read 0 operation and a read 0 operation of the exemplary portion 90 in FIG. 9, in accordance with some embodiments. Referring to FIG. 10B, similar to the timing diagram 40B in FIG. 4B, a read 0 operation is performed during a first clock cycle between time $T_{1016}$ and time $T_{1022}$, and a read 0 operation is performed during a second clock cycle between time $T_{1022}$ and time $T_{1028}$.

Similar to the timing diagram 40B in FIG. 4B, the timing diagram 1009 correspondingly has a portion of a first pre-charge phase between time $T_{1016}$ and time $T_{1018}$, a first output generation phase between time $T_{1018}$ and time $T_{1020}$, a second pre-charge phase between time $T_{1020}$ and time $T_{1024}$, a second output generation phase between time $T_{1024}$ and time $T_{1026}$, and a portion of a third pre-charge phase between time $T_{1026}$ and time $T_{1028}$ for the following son. The tri-state units TS11_3A to TS15_3A, the tri-state unit 340A, the latch 360 in FIG. 9 which are labeled the same as those in FIG. 3A are controlled in the same manner as those in FIG. 3A. The FET $XU_{91}$ in FIG. 9 and the FET $XU_{31}$ in FIG. 3A are of the same conductivity type, and are controlled by the same control signal EN. The FET $XD_{92}$ in FIG. 9 and the FET $XD_{32}$ in FIG. 3A are of same conductivity type, and are correspondingly controlled by the same control signal ENB.

Compared to the timing diagram 40B in FIG. 4B, the global bit line GBL1_9 in FIG. 10B has a corresponding opposite signal value to that of the global bit line GBL1_3 in FIG. 4B during each of the portion of the first pre-charge phase, the second pre-charge phase and the portion of the third pre-charge phase for the following reason. The FET $XU_{92}$ in FIG. 9 and the FET $XU_{32}$ in FIG. 3A are of the same conductivity type, and are correspondingly controlled by the state signals L_B_SIG and L_SIG inverted with respect to each other. The FET $XD_{91}$ in FIG. 9 and the FET $XD_{31}$ in FIG. 3A are of the same conductivity type, and are correspondingly controlled by the state signals L_B_SIG and L_SIG inverted with respect to each other. Furthermore, because of the n-type transistor $XU_{91}$ between the higher power supply node VDD and the global bit line GBL1_9, during the portion of the first pre-charge phase, the global bit line GBL1_9 is pre-charged to the second intermediate level VDD-Vtn, where Vtn is a threshold voltage of the n-type transistor $XU_{91}$. Because of the p-type transistor $XD_{92}$ between the global bit line GBL1_9 and the lower power supply node GND, during the second pre-charge phase and the portion of the third pre-charge phase, the global bit line GBL1_9 is pre-charged to the first intermediate level Vtp, where Vtp is a threshold voltage of the p-type transistor $XD_{92}$.

Similar to the timing diagram 40B in FIG. 4B, the global bit line GBL1_9 in FIG. 10B has a corresponding same signal value as the global bit line GBL1_3 in FIG. 4B, and the output signal Q in FIG. 10B has a corresponding same signal value as the output signal Q in FIG. 4B during each of the first output generation phase and the second output generation phase for the following reason. The data signal D11_SIG in FIG. 10B has the same signal values as the data signal D11_SIG in FIG. 4B. The tri-state units TS11_3A to TS15_3A, the tri-state unit 340A, the latch 360 and the inverter 380 in FIG. 9 which are labeled the same as those in FIG. 3A function in the same manner as those in FIG. 3A. Compared to the timing diagram 40B in FIG. 4B, the state signal L_B_SIG in FIG. 10B has a corresponding opposite signal value to that of the state signal L_SIG in FIG. 4B during each of the first output generation phase and the second output generation phase for the following reason. The state signal L_B_SIG in FIG. 9 is held at the input of the inverter 362 and the output of the tri-state inverter 364 and the state signal L_SIG in FIG. 3A is held at the output of the inverter 362 and the input of the tri-state inverter 364.

Figure 11:
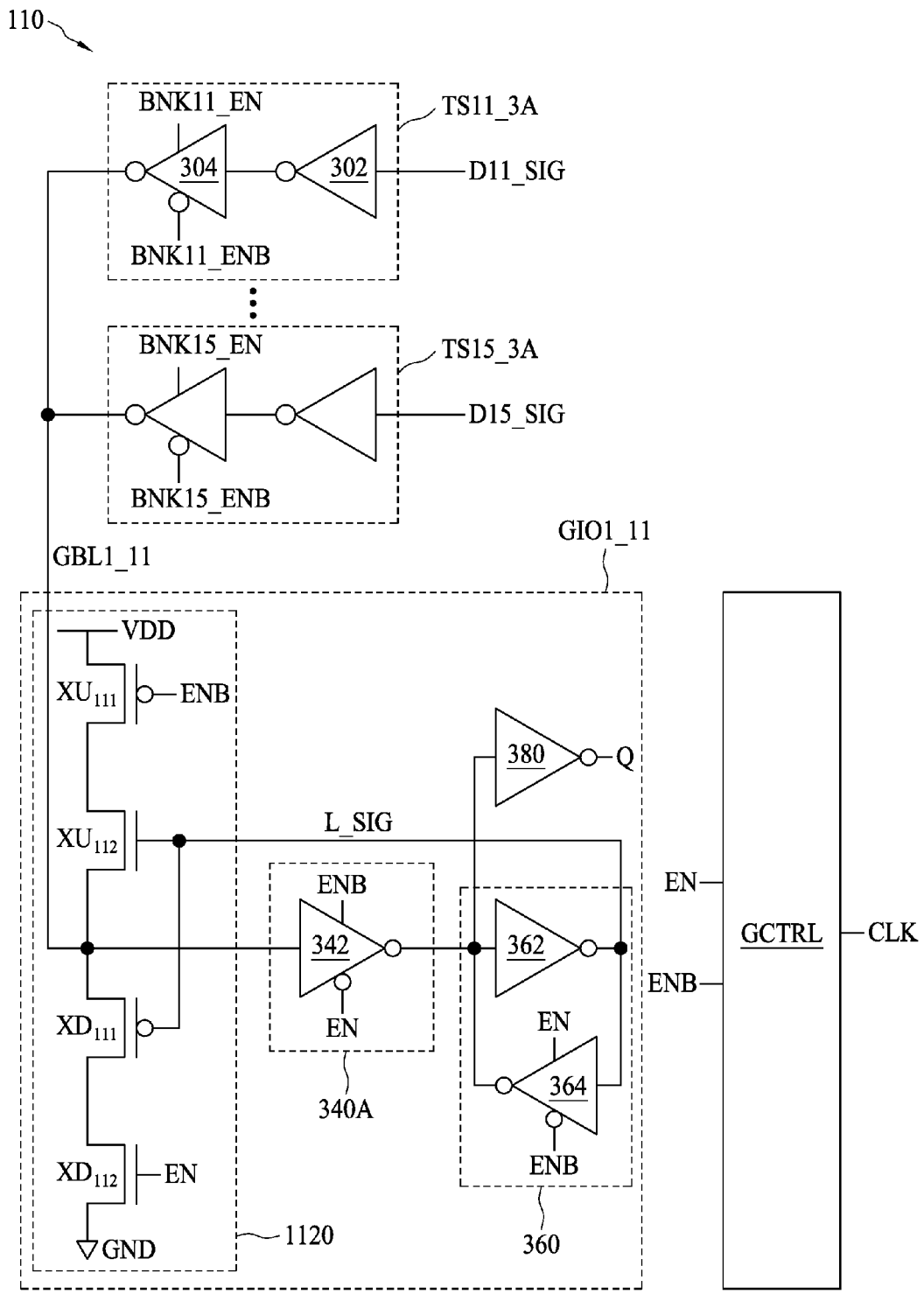
FIG. 11 is a schematic block diagram of an exemplary portion of the multi-bank memory in FIG. 1 with circuits in some of blocks shown, in accordance with some embodiments.

FIG. 11 is a schematic block diagram of an exemplary portion 110 of the multi-bank memory 10 in FIG. 1 with circuits in some of blocks shown, in accordance with some embodiments. Referring to FIG. 11, compared to the exemplary portion 90 in FIG. 9, the exemplary portion 110 includes a self-adjust pre-charge unit 1120 with a p-type transistor $XU_{111}$ and an n-type transistor $XU_{112}$ electrically coupled between a higher power supply node VDD and a global bit line GBL1_11, and a p-type transistor $XD_{111}$ and an n-type transistor $XD_{112}$ electrically coupled between the global bit line GBL1_11 and a lower power supply node GND. Compared to the n-type transistor $XU_{91}$ and the p-type transistor $XU_{92}$ in the exemplary portion 90, the corresponding p-type transistor $XU_{111}$ and the n-type transistor $XU_{112}$ are of opposite conductivity types. Further compared to the n-type transistor $XU_{91}$ and the p-type transistor $XU_{92}$ of the exemplary portion 90, the corresponding p-type transistor $XU_{111}$ and the n-type transistor $XU_{112}$ are correspondingly controlled by a control signal ENB inverted with respect to the control signal EN and a state signal L_SIG inverted with respect to the state signal L_B_SIG. Compared to the n-type transistor $XD_{91}$ and the p-type transistor $XD_{92}$ of the exemplary portion 90, the corresponding p-type transistor $XD_{111}$ and the n-type transistor $XD_{112}$ are of opposite conductivity types. Further compared to the n-type transistor $XD_{91}$ and the p-type transistor $XD_{92}$ of the exemplary portion 90, the corresponding p-type transistor $XD_{111}$ and the n-type transistor $XD_{112}$ are correspondingly controlled by the state signal L_SIG inverted with respect to the state signal L_B_SIG and a control signal EN inverted with respect to the control signal ENB.

In some embodiments, the self-adjust pre-charge unit 1120 includes a higher power supply node VDD and a lower power supply node GND, a p-type transistor $XU_{111}$, an n-type transistor $XU_{112}$, a p-type transistor $XD_{111}$ and an n-type transistor $XD_{112}$. The p-type transistor $XU_{111}$ and the n-type transistor $XU_{112}$ are electrically coupled in series between the higher power supply node VDD and the global bit line GBL1_11. The p-type transistor $XU_{111}$ is controlled by a control signal ENB of a control signal pair EN and ENB. The n-type transistor $XU_{112}$ is controlled by a state signal L_SIG. The state signal L_SIG is held by the latch 360 at the output of the inverter 362 and the input of the tri-state inverter 364. The p-type transistor $XD_{111}$ and the n-type transistor $XD_{112}$ are electrically coupled in series between the global bit line GBL1_11 and the lower power supply node GND. The p-type transistor $XD_{111}$ is controlled by the state signal L_SIG. The n-type transistor $XD_{112}$ is controlled by a control signal EN of the control signal pair EN and ENB. In response to the assertions of the control signal pair EN and ENB, the p-type transistor $XU_{111}$ and the n-type transistor $XD_{112}$ are conducting. Further in response to the state signal L_SIG, one of the n-type transistor $XU_{112}$ and the p-type transistor $XD_{111}$ is conducting. In response to the deassertions of the control signal pair EN and ENB, the p-type transistor $XU_{111}$ and the n-type transistor $XD_{112}$ are cut off.

Figure 12A:
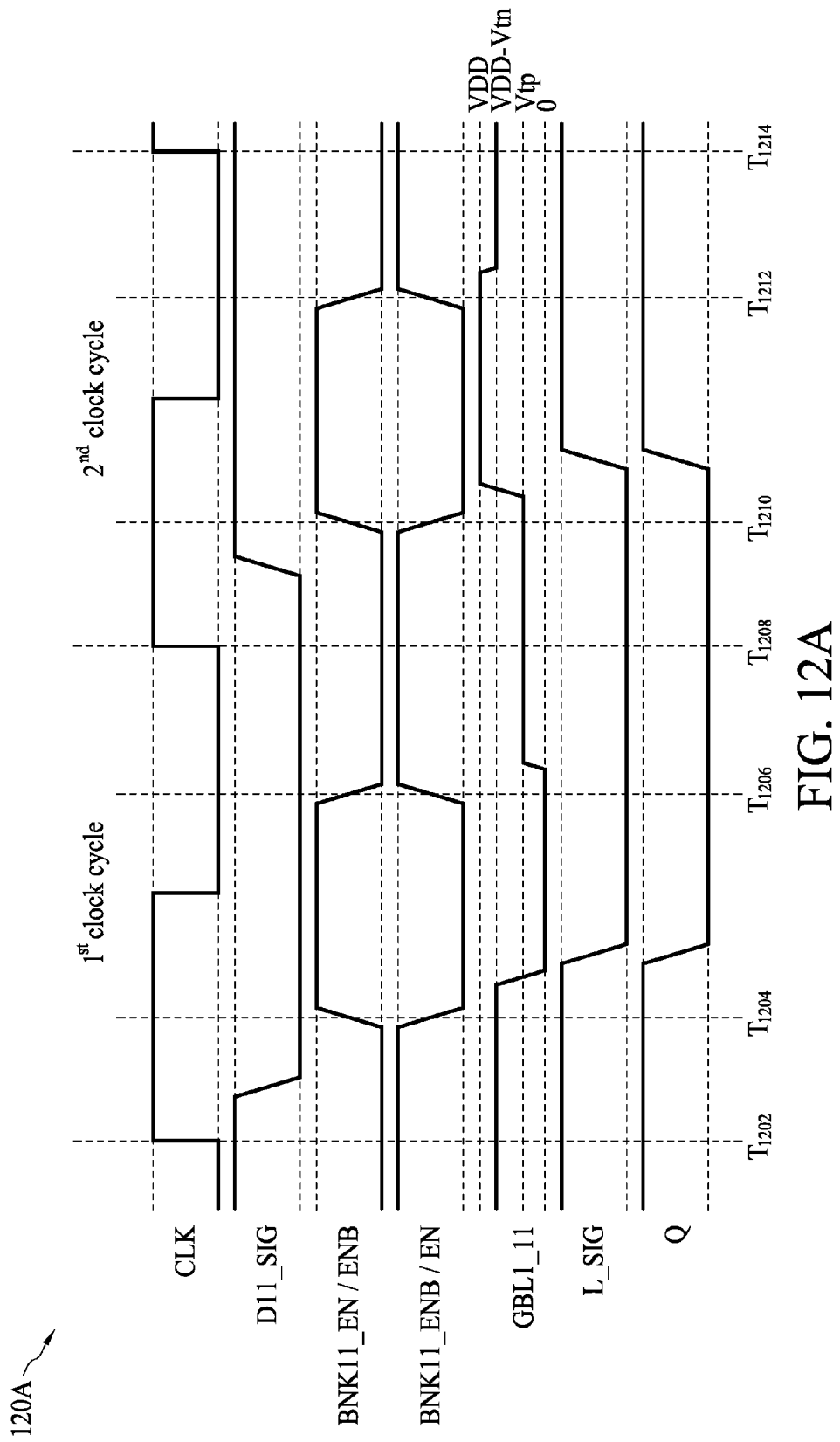
FIG. 12A is a timing diagram for a read 0 operation and a read 1 operation of the exemplary portion in FIG. 11, in accordance with some embodiments.

FIG. 12A is a timing diagram 120A for a read 0 operation and a read 1 operation of the exemplary portion 110 in FIG. 11, in accordance with some embodiments. Referring to FIG. 12A, similar to the timing diagram 100A in FIG. 10A, a read 0 operation is performed during a first clock cycle between time $T_{1202}$ and time $T_{1208}$, and a read 1 operation is performed during a second clock cycle between time $T_{1208}$ and time $T_{1214}$.

Similar to the timing diagram 100A in FIG. 10A, the timing diagram 120A correspondingly has a portion of a first pre-charge phase between time $T_{1202}$ and time $T_{1204}$, a first output generation phase between time $T_{1204}$ and time $T_{1206}$, a second pre-charge phase between time $T_{1206}$ and time $T_{1210}$, a second output generation phase between time $T_{1210}$ and time $T_{1212}$, and a portion of a third pre-charge phase between time $T_{1212}$ and time $T_{1214}$ for the following reason. The tri-state units TS11_3A to TS15_3A, the tri-state unit 340A, the latch 360 in FIG. 11 which are labeled the same as those in FIG. 9 are controlled in the same manner as those in FIG. 9. The FET $XU_{111}$ in FIG. 11 and the FET $XU_{91}$ in FIG. 9 are of opposite conductivity types, and are correspondingly controlled by control signals ENB and EN inverted with respect to each other. The FET $XD_{112}$ in FIG. 11 and the FET $XD_{92}$ in FIG. 9 are of opposite conductivity types, and are correspondingly controlled by control signals EN and ENB inverted with respect to each other.

Similar to the timing diagram 100A in FIG. 10A, the global bit line GBL1_11 in FIG. 12A has a corresponding same signal value as the global bit line GBL1_9 in FIG. 10A during each of the portion of the first pre-charge phase, the second pre-charge phase and the portion of the third pre-charge phase for the following reason. The FET $XU_{112}$ in FIG. 11 and the FET $XU_{92}$ in FIG. 9 are of opposite conductivity types, and are correspondingly controlled by the state signals L_SIG and L_B_SIG inverted with respect to each other. The FET $XD_{111}$ in FIG. 11 and the FET $XD_{91}$ in FIG. 9 are of opposite conductivity types, and are correspondingly controlled by the state signals L_SIG and L_B_SIG inverted with respect to each other. Furthermore, because of the n-type transistor $XU_{112}$ between the higher power supply node VDD and the global bit line GBL1_11, during the portion of the first pre-charge phase and the portion of the third pre-charge phase, the global bit line GBL1_11 is pre-charged to the second intermediate level VDD-Vtn, where Vtn is a threshold voltage of the n-type transistor $XU_{112}$. Because of the p-type transistor $XD_{111}$ between the global bit line GBL1_11 and the lower power supply node GND, during the second pre-charge phase, the global bit line GBL1_11 is pre-charged to the first intermediate level Vtp, where Vtp is a threshold voltage of the p-type transistor $XD_{111}$.

Similar to the timing diagram 100A in FIG. 10A, the global bit line GBL1_11 in FIG. 12A has a corresponding same signal value as the global bit line GBL1_9 in FIG. 10A, and the output signal Q in FIG. 12A has a corresponding same signal value as the output signal Q in FIG. 10A during each of the first output generation phase and the second output generation phase for the following reason. The data signal D11_SIG in FIG. 12A has the same signal values as the data signal D11_SIG in FIG. 10A. The tri-state units TS11_3A to TS15_3A, the tri-state unit 340A, the latch 360 and the inverter 380 in FIG. 11 which are labeled the same as those in FIG. 9 function in the same manner as those in FIG. 9. Compared to the timing diagram 100A in FIG. 10A, the state signal L_SIG in FIG. 1.2A has a corresponding opposite signal value to that of the state signal L_B_SIG in FIG. 10A during each of the first output generation phase and the second output generation phase for the following reason. The state signal L_SIG in FIG. 11 is held at the output of the inverter 362 and the input of the tri-state inverter 364 and the state signal L_B_SIG in FIG. 9 is held at the input of the inverter 362 and the output of the tri-state inverter 364.

Figure 12B:
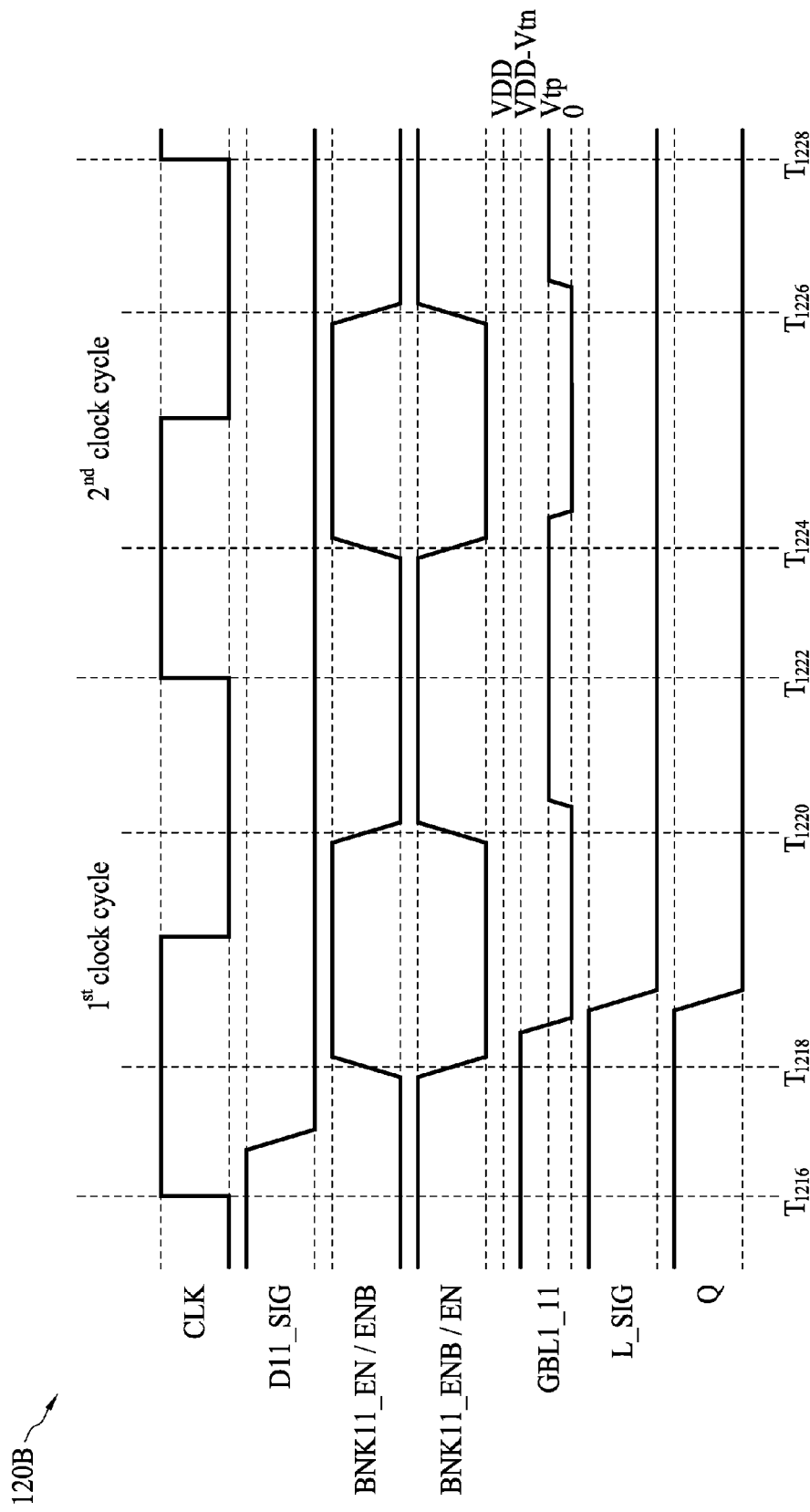
FIG. 12B is a timing diagram for a read 0 operation and a read 0 operation of the exemplary portion in FIG. 11, in accordance with some embodiments.

FIG. 12B is a timing diagram 120B for a read 0 operation and a read 0 operation of the exemplary portion 110 in FIG. 11, in accordance with some embodiments. Referring to FIG. 12B, similar to the timing diagram 100B in FIG. 10B, a read 0 operation is performed during a first clock cycle between time $T_{1216}$ and time $T_{1222}$, and a read 0 operation is performed during a second clock cycle between time $T_{1222}$ and time $T_{1228}$.

Similar to the timing diagram 100B in FIG. 10B, the timing diagram 120B correspondingly has a portion of a first pre-charge phase between time $T_{1216}$ and time $T_{1218}$, a first output generation phase between time $T_{1218}$ and time $T_{1220}$, a second pre-charge phase between time $T_{1220}$ and time $T_{1224}$, a second output generation phase between time $T_{1224}$ and time $T_{1226}$, and a portion of a third pre-charge phase between time $T_{1226}$ and time $T_{1228}$ for the following reason. The tri-state units TS11_3A to TS15_3A, the tri-state unit 340A, the latch 360 in FIG. 11 which are labeled the same as those in FIG. 9 are controlled in the same manner as those in FIG. 9. The FET $XU_{11}$ in FIG. 11 and the FET $XU_{91}$ in FIG. 9 are of opposite conductivity types, and are correspondingly controlled by control signals ENB and EN inverted with respect to each other. The FET $XU_{112}$ in FIG. 11 and the FET $XU_{92}$ in FIG. 9 are of opposite conductivity types, and are correspondingly controlled by control signals EN and ENB inverted with respect to each other.

Similar to the timing diagram 100B in FIG. 10B, the global bit line GBL1_11 in FIG. 12B has a corresponding same signal value as the global bit line GBL1_9 in FIG. 10B during each of the portion of the first pre-charge phase, the second pre-charge phase and the portion of the third pre-charge phase for the following reason. The FET $XU_{112}$ in FIG. 11 and the FET $XU_{92}$ in FIG. 9 are of opposite conductivity types, and are correspondingly controlled by the state signals L_SIG and L_B_SIG inverted with respect to each other. The FET $XD_{1r1}$ in FIG. 11 and the FET $XD_1$ in FIG. 9 are of opposite conductivity types, and are correspondingly controlled by the state signals L_SIG and L_B_SIG inverted with respect to each other. Furthermore, because of the n-type transistor $XU_{112}$ between the higher power supply node VDD and the global bit line GBL1_11, during the portion of the first pre-charge phase, the global bit line GBL1_11 is pre-charged to the second intermediate level VDD-Vtn, where Vtn is a threshold voltage of the n-type transistor $XU_{112}$. Because of the p-type transistor $XD_{111}$ between the global bit line GBL1_11 and the lower power supply node GND, during the second pre-charge phase and the portion of the third pre-charge phase, the global bit line GBL1_11 is pre-charged to the first intermediate level Vtp, where Vtp is a threshold voltage of the p-type transistor $XD_{111}$.

Similar to the timing diagram 100B in FIG. 10B, the global bit line GBL1_11 in FIG. 12B has a corresponding same signal value as the global bit line GBL1_9 in FIG. 10B, and the output signal Q in FIG. 12B has a corresponding same signal value as the output signal Q in FIG. 10B during each of the first output generation phase and the second output generation phase for the following reason. The data signal D11_SIG in FIG. 12B has the same signal values as the data signal D11_SIG in FIG. 10B. The tri-state units TS11_3A to TS15_3A, the tri-state unit 340A, the latch 360 and the inverter 380 in FIG. 11 which are labeled the same as those in FIG. 9 function in the same manner as those in FIG. 9. Compared to the timing diagram 100B in FIG. 10B, the state signal L_SIG in FIG. 12B has a corresponding opposite signal value to that of the state signal L_B_SIG in FIG. 10B during each of the first output generation phase and the second output generation phase for the following reason. The state signal L_SIG in FIG. 11 is held at the output of the inverter 362 and the input of the tri-state inverter 364 and the state signal L_B_SIG in FIG. 9 is held at the input of the inverter 362 and the output of the tri-state inverter 364.

Figure 13:
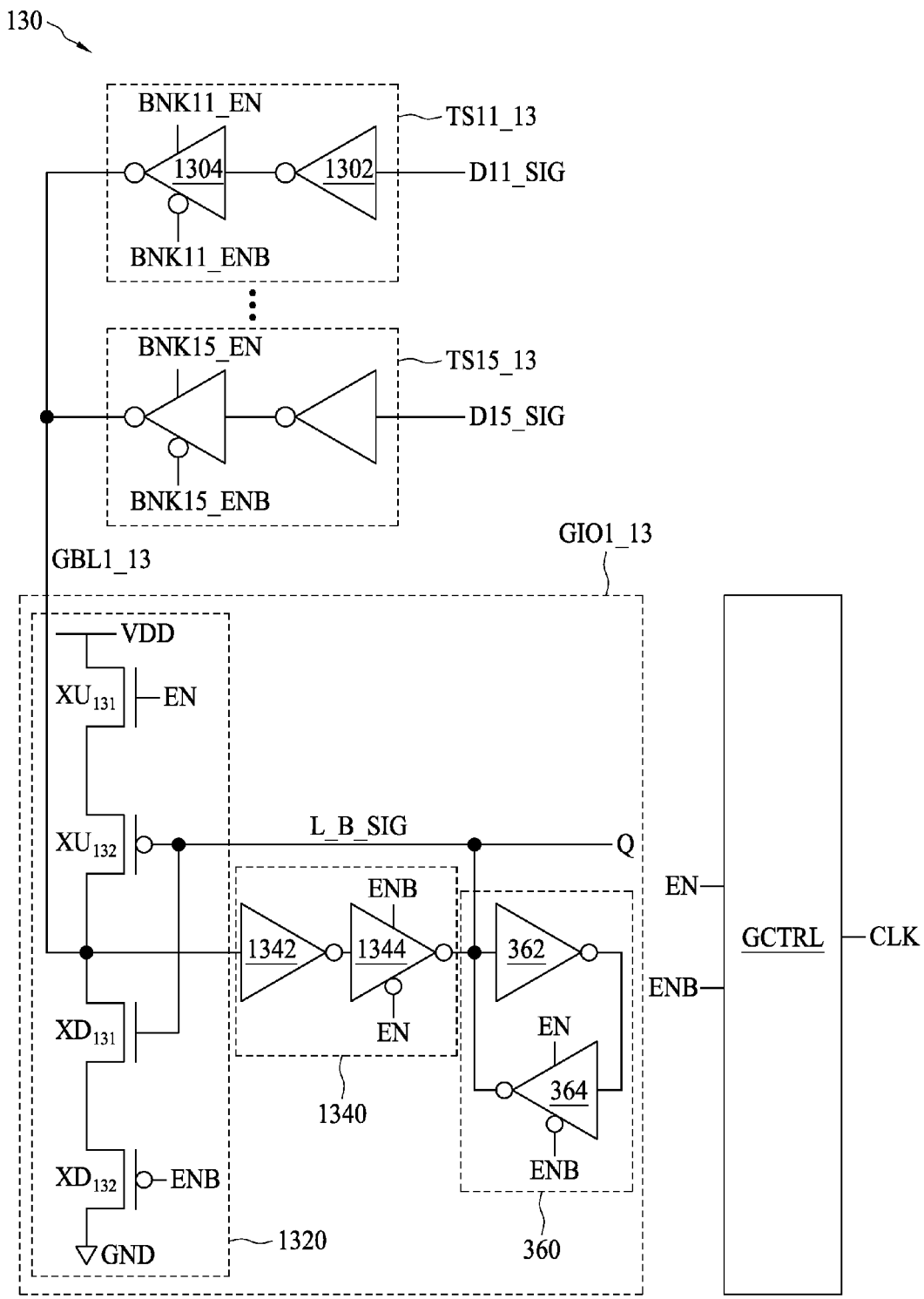
FIG. 13 is a schematic block diagram of an exemplary portion of the multi-bank memory in FIG. 1 with circuits in some of blocks shown, in accordance with some embodiments.

FIG. 13 is a schematic block diagram of an exemplary portion 130 of the multi-bank memory 10 in FIG. 1 with circuits in some of blocks shown, in accordance with some embodiments. Referring to FIG. 13, compared to the exemplary portion 30A in FIG. 3A, each of tri-state units TS11_13 to TS15_13 is non-inverting with respect to a tri-state unit 1340. In addition, compared to the exemplary portion 30A, the exemplary portion 130 includes a self-adjust pre-charge unit 1320 with an n-type transistor $XU_{131}$ and a p-type transistor $XU_{132}$ electrically coupled between a higher power supply node VDD and a global bit line GBL1_13, and an n-type transistor $XD_{131}$ and a p-type transistor $XD_{132}$ electrically coupled between the global bit line GBL1_13 and a lower power supply node GND. Similar to the n-type transistor $XU_{31}$ of the exemplary portion 30A, the n-type transistor $XU_{131}$ is controlled by a control signal EN. Compared to the p-type transistor $XU_{32}$ of the exemplary portion 30A, the p-type transistor $XU_{132}$ is controlled by a state signal L_B_SIG having the same signal values as those of the state signal L_SIG in FIG. 3A. Compared to the n-type transistor $XD_{31}$ of the exemplary portion 30A, the n-type transistor $XD_{131}$ is controlled by the state signal L_B_SIG. Similar to the p-type transistor $XU_{32}$ of the exemplary portion 30A, the p-type transistor $XD_{132}$ is controlled by a control signal ENB. Furthermore, compared to the exemplary portion 30A, the inverter 380 is not included in the exemplary portion 130 and therefore the output signal Q is directly generated at where the tri-state unit 1340 is electrically coupled to the input of the inverter 362 and the output of the tri-state inverter 364.

Referring to FIG. 13, in some embodiments, the tri-state units TS1.113 to TS15_13 correspondingly pass the data signals D11_SIG to D15_SIG to the global bit line GBL1_13 correspondingly in response to the bank enable signal pair BNK11_EN and BNK11_ENB to the bank enable signal pair BNK15_EN and BNK15_ENB. In some embodiments, each of the tri-state units TS11_13 to TS15_13 includes a corresponding cascaded inverter and tri-state inverter 1302 and 1304. The cascaded inverter and tri-state inverter 1302 and 1304 of the tri-state unit TS11_13 is described below as an example. An input of the inverter 1302 receives the data signal D11_SIG. An output of the inverter 1302 is electrically coupled to an input of the tri-state inverter 1304. An output of the tri-state inverter 1304 is electrically coupled to the global bit line GBL1_13. The tri-state inverter 1304 is controlled by the bank enable signal pair BNK11_EN and BNK11_ENB. In response to assertions of the bank enable signal pair BNK11_EN and BNK11_ENB, the tri-state inverter 1304 acts as an inverter. In response to deassertions of the bank enable signal pair BNK11_EN and BNK11_ENB, the tri-state inverter 1304 is in a high impedance state. Therefore, in response to assertions of one bank enable signal pair (e.g. BNK11_EN and BNK11_ENB) and deassertions of other bank enable signal pairs (e.g. the bank enable signal pair BNK12_EN and BNK12_ENB to the bank enable signal pair BNK15_EN and BNK15_ENB), the tri-state unit (e.g. TS11_13) allows the data signal (e.g. D11_SIG) resulted from the memory bank (e.g. MB11 shown in FIG. 1) to be non-invertedly passed to the global bit line GBL1_3. In response to deassertions of all of the bank enable signal pair BNK11_EN and BNK11_ENB to the bank enable signal pair BNK15_EN and BNK15_ENB, the tri-state units TS11_13 to TS15_13 electrically isolate the global bit line GBL1_13 from the memory banks MB11 to MB15.

The tri-state unit 1340 includes a cascaded inverter and tri-state inverter 1342 and 1344. An input of the inverter 1342 is electrically coupled to the global bit line GBL1_13. An output of the inverter 1342 is electrically coupled to an input of the tri-state inverter 1344. An output of the tri-state inverter 1344 is electrically coupled to an input of the inverter 362. In response to deassertions of the control signal pair EN and ENB, the tri-state inverter 1344 acts as an inverter and therefore the cascaded inverter and tri-state inverter 1342 and 1344 electrically couples the global bit line GBL1_13 to the latch 360. In response to assertions of the control signal pair EN and ENB, the tri-state unit 1340 is in a high impedance state and therefore electrically isolates the global bit line GBL1_13 from the latch 360. The tri-state unit 1340 is non-inverting with respect to the tri-state unit TS11_13. The state signal L_B_SIG is held at the input of the inverter 362 and an output of the tri-state inverter 364. Therefore, the state signal L_B_SIG is non-inverting with respect to the data signal D11_SIG. The output signal Q is generated at the electrically coupled output of the tri-state unit 1340, input of the inverter 362 and output of the inverter 364.

The self-adjust pre-charge unit 1320 in FIG. 13 has the same configuration as the self-adjust pre-charge unit 320 in FIG. 3A except the p-type transistor $XU_{132}$ and the n-type transistor $XD_{131}$ are controlled by the state signal $L\_B_{SIG}$. The state signal L_B_SIG is non-inverting with respect to the data signal D11_SIG. Therefore, the state signal L_B_SIG has the same values as the state signal L_SIG in FIG. 3A. The output signal Q also has the same values as the output signal Q in FIG. 3A for the tri-state unit 1340 is non-inverting with respect to the tri-state unit TS11_13 and the inverter 380 in FIG. 3A is removed in FIG. 13. As a result, a timing diagram for a read 0 operation and a read 1 operation of the exemplary portion 130 in FIG. 13 is the same as the timing diagram 40A in FIG. 4A except the state signal L_SIG is replaced by the state signal L_B_SIG which has the same value as the state signal L_SIG in FIG. 4A. A timing diagram for a read 0 operation and a read 0 operation of the exemplary portion 130 in FIG. 13 is the same as the timing diagram 403 in FIG. 4B except the state signal L_SIG is replaced by the state signal L_B_SIG which has the same value as the state signal L_SIG in FIG. 4B.

Figure 14:
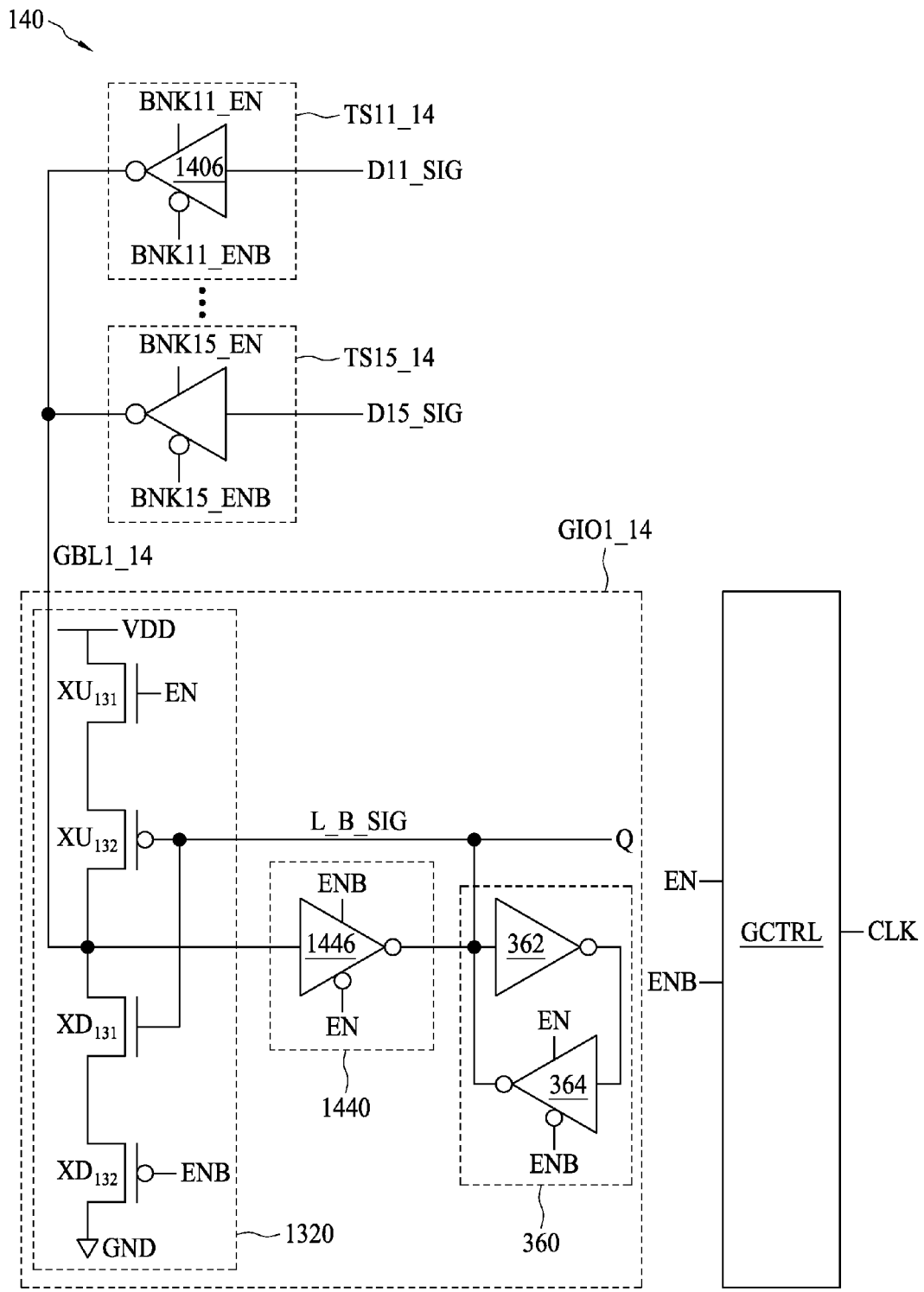
FIG. 14 is a schematic block diagram of an exemplary portion of the multi-bank memory in FIG. 1 with circuits in some of blocks shown, in accordance with some embodiments.

FIG. 14 is a schematic block diagram of an exemplary portion 140 of the multi-bank memory 10 in FIG. 1 with circuits in some of blocks shown, in accordance with some embodiments. Referring to FIG. 14, compared to the exemplary portion 50 in FIG. 5, each of tri-state units TS11_14 to TS15_14 is non-inverting with respect to a tri-state unit 1440. In addition, compared to the exemplary portion 50, the exemplary portion 140 includes a self-adjust pre-charge unit 1320 with an n-type transistor $XU_{131}$ and a p-type transistor $XU_{132}$ electrically coupled between a higher power supply node VDD and a global bit line GBL1_13, and an n-type transistor $XD_{131}$ and a p-type transistor $XD_{132}$ electrically coupled between the global bit line GBL1_14 and a lower power supply node GND. Similar to the n-type transistor $XU_{31}$ of the exemplary portion 50, the n-type transistor $XU_{131}$ is controlled by a control signal EN. Compared to the p-type transistor $XU_{32}$ of the exemplary portion 50, the p-type transistor $XU_{132}$ is controlled by a state signal L_B_SIG having the same signal values as those of the state signal L_SIG in FIG. 5. Compared to the n-type transistor $XD_{31}$ of the exemplary portion 50, the p-type transistor $XD_{131}$ is controlled by the state signal L_B_SIG. Similar to the p-type transistor $XD_{32}$ of the exemplary portion 50, the p-type transistor $XD_{132}$ is controlled by a control signal ENB. Furthermore, compared to the exemplary portion 50, the inverter 380 is not included in the exemplary portion 140 and therefore the output signal Q is directly generated at where the tri-state unit 1440 is electrically coupled to the input of the inverter 362 and the output of the tri-state inverter 364.

Referring to FIG. 14, in some embodiments, the tri-state units TS11_14 to TS15_14 correspondingly pass the data signals D11_SIG to D15_SIG to the global bit line GBL1_14 correspondingly in response to the bank enable signal pair BNK11_EN and BNK11_ENB the bank enable signal pair BNK15_EN and BNK15_ENB. In some embodiments, each of the tri-state units TS11_14 to and TS15_14 includes a corresponding tri-state inverter 1406. The tri-state inverter 1406 of the tri-state unit TS11_14 is described below as an example. An input of the tri-state inverter 1406 receives the data signal D11_SIG. An output of the tri-state inverter 1406 is electrically coupled to the global bit line GBL1_14. The tri-state inverter 1406 is controlled by the bank enable signal pair BNK11_EN and BNK11_ENB. In response to assertions of the bank enable signal pair BNK11_EN and BNK11_ENB, the tri-state inverter 1406 acts as an inverter. In response to deassertions of the bank enable signal pair BNK11_EN and BNK11_ENB, the tri-state inverter 1406 is in a high impedance state. Therefore, in response to assertions of one bank enable signal pair (e.g. BNK11_EN and BNK11_ENB) and deassertions of other bank enable signal pairs (e.g. the bank enable signal pair BNK12_EN and BNK12_ENB to the bank enable signal pair BNK15_EN and BNK15_ENB), the tri-state unit (e.g. TS11_14) allows the data signal (e.g. D11_SIG) resulted from the memory bank (e.g. MB11 shown in FIG. 1) to be invertedly passed to the global bit line GBL1_14. In response to deassertions of all of the bank enable signal pair BNK11_EN and BNK11_ENB to the bank enable signal pair BNK15_EN and BNK15_ENB, the tri-state units TS11_14 to TS15_14 electrically isolate the global bit line GBL1_14 from the memory banks MB11 to MB15.

The tri-state unit 1440 includes a tri-state inverter 1446. An input of the tri-state inverter 1446 is electrically coupled to the global bit line GBL1_14. An output of the tri-state inverter 1446 is electrically coupled to an input of the inverter 362. In response to deassertions of the control signal pair EN and ENB, the tri-state inverter 1446 acts as an inverter and therefore electrically couples the global bit line GBL1_14 to the latch 360. In response to assertions of the control signal pair EN and ENB, the tri-state unit 1440 is in a high impedance state and therefore electrically isolates the global bit line GBL1_14 from the latch 360. The tri-state unit 1440 is non-inverting with respect to the tri-state unit TS11_14. The state signal L_B_SIG is held at the input of the inverter 362 and an output of the tri-state inverter 364. Therefore, the state signal L_B_SIG is non-inverting with respect to the data signal D11_SIG. The output signal Q is generated at the electrically coupled output of the tri-state unit 1440, input of the inverter 362 and output of the inverter 364.

The self-adjust pre-charge unit 1320 in FIG. 14 has the same configuration as the self-adjust pre-charge unit 520 in FIG. 5 except the p-type transistor $XU_{132}$ and the n-type transistor $XD_{131}$ are controlled by the state signal L_B_SIG. The state signal L_B_SIG is non-inverting with respect to the data signal D11_SIG. Therefore, the state signal L_B_SIG has the same values as the state signal L_SIG in FIG. 5. The output signal Q also has the same values as the output signal Q in FIG. 5 for the tri-state unit 1440 is non-inverting with respect to the tri-state unit TS11_14 and the inverter 380 in FIG. 5 is removed in FIG. 14. As a result, a timing diagram for a read 0 operation and a read 1 operation of the exemplary portion 140 in FIG. 14 is the same as the timing diagram 60A in FIG. 6A except the state signal L_SIG is replaced by the state signal L_B_SIG which has the same value as the state signal L_SIG in FIG. 6A. A timing diagram for a read 0 operation and a read 0 operation of the exemplary portion 140 in FIG. 14 is the same as the timing diagram 60B in FIG. 6B except the state signal L_SIG is replaced by the state signal L_B_SIG which has the same value as the state signal L_SIG in FIG. 6B.

Figure 15:
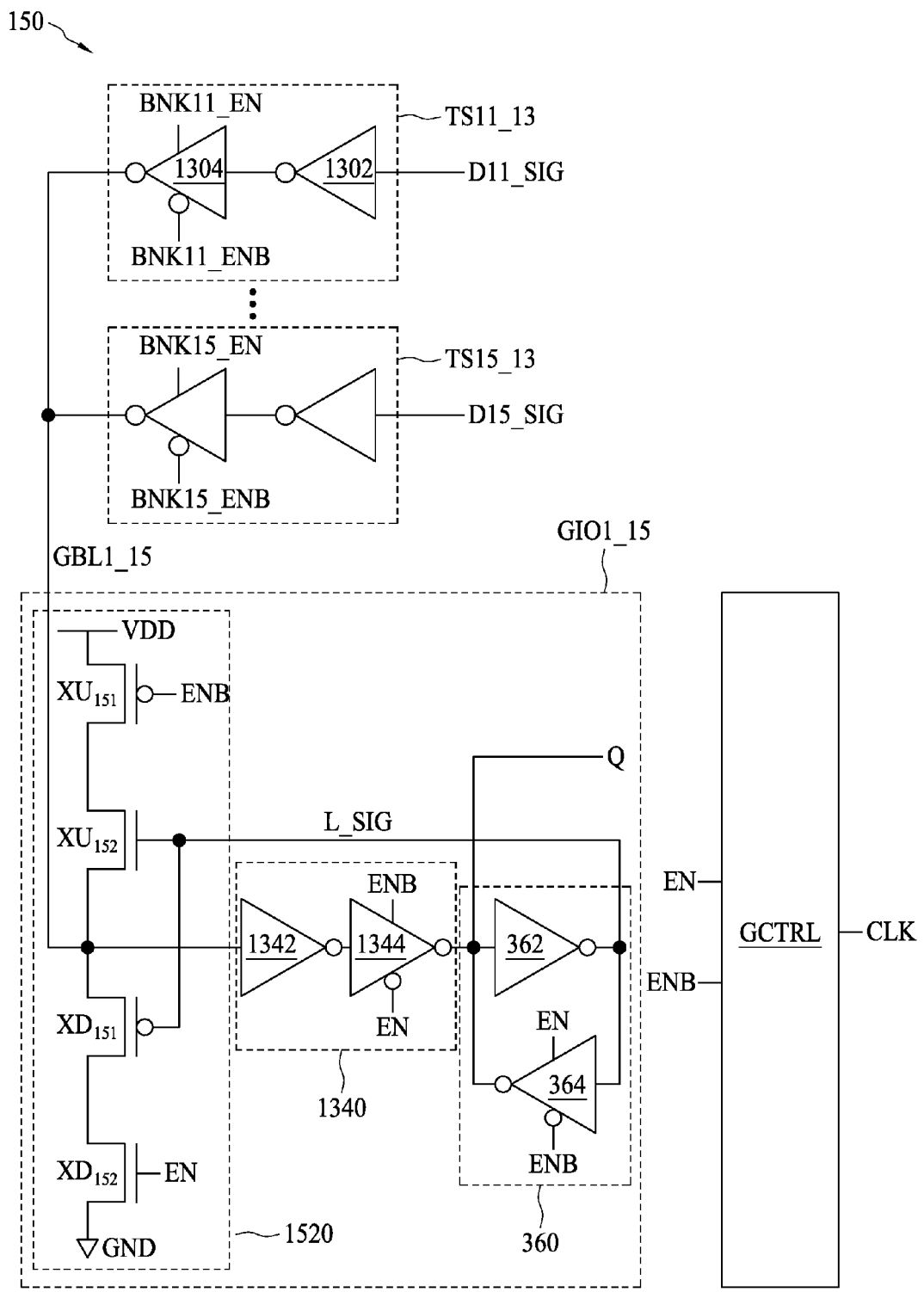
FIG. 15 is a schematic block diagram of an exemplary portion of the multi-bank memory in FIG. 1 with circuits in some of blocks shown, in accordance with some embodiments.

FIG. 15 is a schematic block diagram of an exemplary portion 150 of the multi-bank memory 10 in FIG. 1 with circuits in some of blocks shown, in accordance with some embodiments. Referring to FIG. 15, compared to the exemplary portion 70 in FIG. 7, each of tri-state units TS11_13 to TS15_13 is non-inverting with respect to a tri-state unit 1340. In addition, compared to the exemplary portion 70, the exemplary portion 150 includes a self-adjust pre-charge unit 1520 with a p-type transistor $XU_{151}$ and an n-type transistor $XU_{152}$ electrically coupled between a higher power supply node VDD and a global bit line GBL1_15, and a p-type transistor $XD_{151}$ and an n-type transistor $XD_{152}$ electrically coupled between the global bit line GBL1_15 and a lower power supply node GND. Similar to the p-type transistor $XU_{71}$ of the exemplary portion 70, the p-type transistor $XU_{151}$ is controlled by a control signal CNB. Compared to the n-type transistor $XU_{72}$ of the exemplary portion 70, the n-type transistor $XU_{152}$ is controlled by a state signal L_SIG having the same signal values as those of the state signal L_B_SIG in FIG. 7. Compared to the p-type transistor $XD_{71}$ of the exemplary portion 70, the p-type transistor $XD_{151}$ is controlled by the state signal L_SIG. Similar to the n-type transistor $XD_{72}$ of the exemplary portion 70, the n-type transistor $XD_{152}$ is controlled by a control signal EN. Furthermore, compared to the exemplary portion 70, the inverter 380 is not included in the exemplary portion 150 and therefore the output signal Q is directly generated at where the tri-state unit 1340 is electrically coupled to the input of the inverter 362 and the output of the tri-state inverter 364.

The self-adjust pre-charge unit 1520 in FIG. 15 has the same configuration as the self-adjust pre-charge unit 720 in FIG. 7 except the n-type transistor $XU_{152}$ and the p-type transistor $XD_{151}$ are controlled by the state signal L_SIG. The state signal L_SIG is inverting with respect to the data signal D11_SIG. Therefore, the state signal L_SIG has the same values as the state signal L_B_SIG in FIG. 7. The output signal Q also has the same values as the output signal Q in FIG. 7 for the tri-state unit 1340 is non-inverting with respect to the tri-state unit TS11_13 and the inverter 380 in FIG. 3A is removed in FIG. 13. As a result, a timing diagram for a read 0 operation and a read 1 operation of the exemplary portion 150 in FIG. 15 is the same as the timing diagram 80A in FIG. 8A except the state signal L_B_SIG is replaced by the state signal L_SIG which has the same value as the state signal L_B_SIG in FIG. 8A. A timing diagram for a read 0 operation and a read 0 operation of the exemplary portion 150 in FIG. 15 is the same as the timing diagram 809 in FIG. 8B except the state signal L_SIG is replaced by the state signal which has the same value as the state signal L_B_SIG in FIG. 80B.

Figure 16:
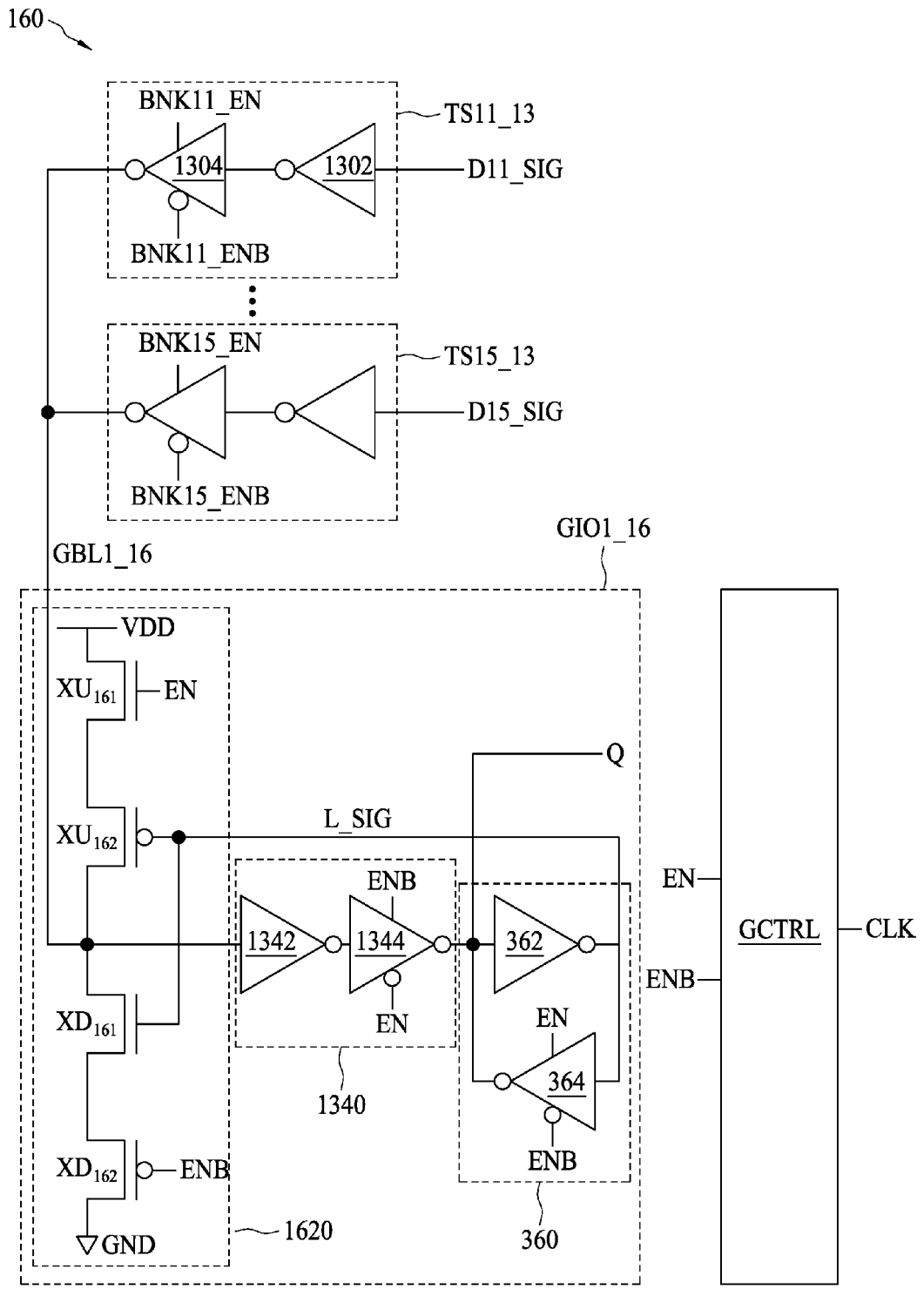
FIG. 16 is a schematic block diagram of an exemplary portion of the multi-bank memory in FIG. 1 with circuits in some of blocks shown, in accordance with some embodiments.

FIG. 16 is a schematic block diagram of an exemplary portion 160 of the multi-bank memory 10 in FIG. 1 with circuits in some of blocks shown, in accordance with some embodiments. Referring to FIG. 16, compared to the exemplary portion 90 in FIG. 9, each of tri-state units TS11_13 to TS15_13 is non-inverting with respect to a tri-state unit 1340. In addition, compared to the exemplary portion 90, the exemplary portion 160 includes a self-adjust pre-charge unit 1620 with an n-type transistor $XU_{161}$ and a p-type transistor $XU_{162}$ electrically coupled between a higher power supply node VDD and a global bit line GBL1_16, and an n-type transistor $XD_{161}$ and a p-type transistor $XD_{162}$ electrically coupled between the global bit line GBL1_16 and a lower power supply node GND. Similar to the n-type transistor $XU_{91}$ of the exemplary portion 90, the n-type transistor $XU_{161}$ is controlled by a control signal EN. Compared to the p-type transistor $XU_{92}$ of the exemplary portion 90, the p-type transistor $XU_{162}$ is controlled by a state signal L_SIG having the same signal values as those of the state signal L_B_SIG in FIG. 9. Compared to the n-type transistor $XD_{91}$ of the exemplary portion 90, the n-type transistor $XD_{161}$ is controlled by the state signal L_SIG. Similar to the p-type transistor $XD_{92}$ of the exemplary portion 90, the p-type transistor $XD_{162}$ is controlled by a control signal ENB. Furthermore, compared to the exemplary portion 90, the inverter 380 is not included in the exemplary portion 160 and therefore the output signal Q is directly generated at where the tri-state unit 1340 is electrically coupled to the input of the inverter 362 and the output of the tri-state inverter 364.

The self-adjust pre-charge unit 1620 in FIG. 16 has the same configuration as the self-adjust pre-charge unit 920 in FIG. 9 except the p-type transistor $XU_{162}$ and the n-type transistor $XD_{161}$ are controlled by the state signal L_SIG. The state signal L_SIG is inverting with respect to the data signal D11_SIG. Therefore, the state signal L_SIG has the same values as the state signal L_B_SIG in FIG. 9. The output signal Q also has the same values as the output signal Q in FIG. 9 for the tri-state unit 1340 is non-inverting with respect to the tri-state unit TS11_13 and the inverter 380 in FIG. 3A is removed in FIG. 16. As a result, a timing diagram for a read 0 operation and a read 1 operation of the exemplary portion 160 in FIG. 16 is the same as the timing diagram 100A in FIG. 10A except the state signal L_B_SIG is replaced by the state signal L_SIG which has the same value as the state signal L_B_SIG in FIG. 10A. A timing diagram for a read 0 operation and a read 0 operation of the exemplary portion 160 in FIG. 16 is the same as the timing diagram 100B in FIG. 10B except the state signal L_B_SIG is replaced by the state signal L_SIG which has the same value as the state signal L_B_SIG in FIG. 100B.

Figure 17:
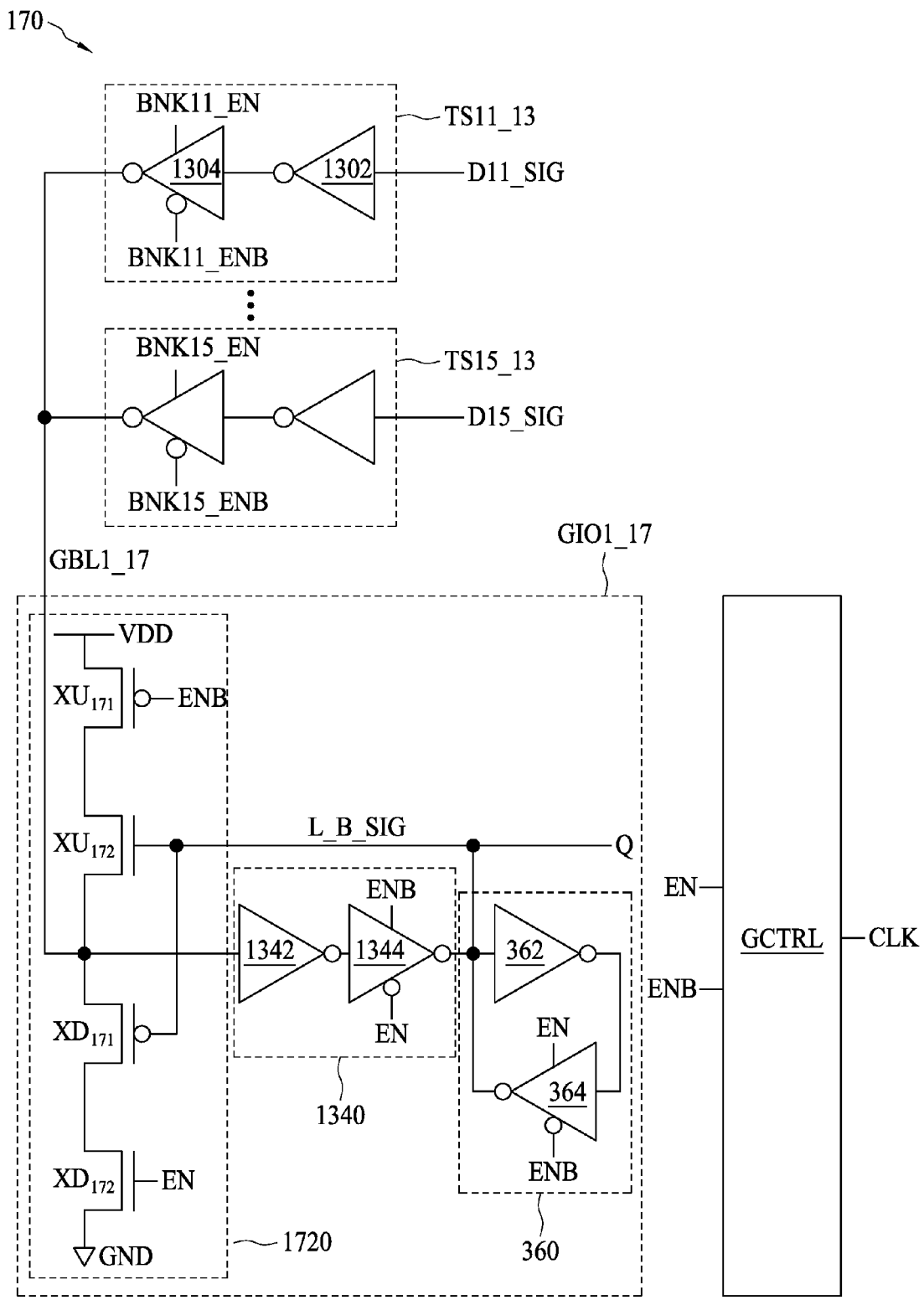
FIG. 17 is a schematic block diagram of an exemplary portion of the multi-bank memory in FIG. 1 with circuits in some of blocks shown, in accordance with some embodiments.

FIG. 17 is a schematic block diagram of an exemplary portion 170 of the multi-bank memory 10 in FIG. 1 with circuits in some of blocks shown, in accordance with some embodiments. Referring to FIG. 17, compared to the exemplary portion 110 in FIG. 11, each of tri-state units TS11_13 to TS15_13 is non-inverting with respect to a tri-state unit 1340. In addition, compared to the exemplary portion 110, the exemplary portion 170 includes a self-adjust pre-charge unit 1720 with a p-type transistor $XU_{171}$ and an n-type transistor $XU_{172}$ electrically coupled between a higher power supply node VDD and a global bit line GBL1_17, and a p-type transistor $XD_{171}$ and an n-type transistor $XD_{172}$ electrically coupled between the global bit line GBL1_17 and a lower power supply node GND. Similar to the p-type transistor $XU_{111}$ of the exemplary portion 110, the p-type transistor $XU_{171}$ is controlled by a control signal ENB. Compared to the n-type transistor $XU_{112}$, of the exemplary portion 110, the n-type transistor $XU_{172}$ is controlled by a state signal L_B_SIG having the same signal values as those of the state signal L_SIG in FIG. 11. Compared to the p-type transistor $XD_{111}$ of the exemplary portion 110, the p-type transistor $XD_{171}$ is controlled by the state signal L_B_SIG. Similar to the n-type transistor $XD_{112}$ of the exemplary portion 110, the n-type transistor $XD_{172}$ is controlled by a control signal EN. Furthermore, compared to the exemplary portion 110, the inverter 380 is not included in the exemplary portion 170, and therefore the output signal Q is directly generated at where the tri-state unit 1340 is electrically coupled to the input of the inverter 362 and the output of the tri-state inverter 364.

The self-adjust pre-charge unit 1720 in FIG. 17 has the same configuration as the self-adjust pre-charge unit 1120 in FIG. 11 except the n-type transistor $XD_{172}$ and the p-type transistor $XD_{171}$ are controlled by the state signal L_B_SIG. The state signal L_B_SIG is non-inverting with respect to the data signal D11_SIG. Therefore, the state signal L_B_SIG has the same values as the state signal L_SIG in FIG. 11. The output signal Q also has the same values as the output signal Q in FIG. 11 for the tri-state unit 1340 is non-inverting with respect to the tri-state unit TS11_13 and the inverter 380 in FIG. 3A is removed in FIG. 13. As a result, a timing diagram for a read 0 operation and a read 1 operation of the exemplary portion 170 in FIG. 17 is the same as the timing diagram 120A in FIG. 12A except the state signal L_SIG is replaced by the state signal L_B_SIG which has the same value as the state signal L_SIG in FIG. 12A. A timing diagram for a read 0 operation and a read 0 operation of the exemplary portion 170 in FIG. 17 is the same as the timing diagram 120B in FIG. 12B except the state signal L_SIG is replaced by the state signal L_B_SIG which has the same value as the state signal L_SIG in FIG. 120B.

Some embodiments have one or a combination of the following features and/or advantages. In some embodiments, a self-adjust pre-charge unit pre-charges a global bit line to an intermediate level during the global bit line is electrically isolated from elements resulting in output generation and transitions from the intermediate level to a logical high value or a logical low value during output generation through the global bit line. Therefore, compared to the other approaches in which a full swing transition occurs in a global bit line to reflect data transition, the global bit line transitioning from the intermediate level to the logical high value or logical low value to reflect data transition in present embodiments incur less delay in output generation.

In some embodiments, a memory device includes a memory bank, a global data line, a first tri-state unit, a latch, a second tri-state unit and a pre-charge unit. The first tri-state unit is configured between the memory bank and the global data line. The latch is configured to provide a state signal based on a data signal provided from the memory bank. The second tri-state unit is configured between the global data line and the latch. The second tri-state unit is inverting with respect to the first tri-state unit. The pre-charge unit includes a first n-type transistor, a first p-type transistor, a second n-type transistor, and a second p-type transistor. The first n-type transistor and the first p-type transistor are electrically coupled in series between a higher power supply node and the global data line. The second n-type transistor and the second p-type transistor electrically are coupled in series between the global data line and a lower power supply node. During the global data line is caused to be electrically isolated from the memory bank by the first tri-state unit and from the latch by the second tri-state unit, a first pair of transistors are conducting, and one transistor of a second pair of transistors is conducting in response to the state signal. Each pair of the first pair of transistors and the second pair of transistors are correspondingly between the higher power supply node and the global data line and between the global data line and the lower power supply node. The first pair of transistors are of opposite conductivity types. The second pair of transistors are transistors other than the first pair of transistors.

In some embodiments, a memory device includes a memory bank, a global data line, a first tri-state unit, a latch, a second tri-state unit and a pre-charge unit. The first tri-state unit is configured between the memory bank and the global data line. The latch is configured to provide a state signal based on a data signal provided from the memory bank. The second tri-state unit is configured between the global data line and the latch. The second tri-state unit is non-inverting with respect to the first tri-state unit. The pre-charge unit includes a first n-type transistor, a first p-type transistor, a second n-type transistor, and a second p-type transistor. The first n-type transistor and the first p-type transistor are electrically coupled in series between a higher power supply node and the global data line. The second n-type transistor and the second p-type transistor electrically are coupled in series between the global data line and a lower power supply node. During the global data line is caused to be electrically isolated from the memory bank by the first tri-state unit and from the latch by the second tri-state unit, a first pair of transistors are conducting, and one transistor of a second pair of transistors is conducting in response to the state signal. Each pair of the first pair of transistors and the second pair of transistors are correspondingly between the higher power supply node and the global data line and between the global data line and the lower power supply node. The first pair of transistors are of opposite conductivity types. The second pair of transistors are transistors other than the first pair of transistors.

In some embodiments, in a method, a data signal resulted from a memory bank is allowed to be passed to a global data line. The global data line is prevented from being pre-charged during the data signal is allowed to be passed to the global data line. The global data line is electrically coupled to a latch during the data signal is allowed to be passed to the global data line. A state signal is latched based on the data signal by the latch. The global data line is electrically isolated from the memory bank. The global data line is electrically isolated from the latch during the global data line is electrically isolated from the memory bank. The global data line is pre-charged to a first intermediate level or a second intermediate level depending on the state signal during the global data line is electrically isolated from the memory bank. The first intermediate level and the second intermediate level are between a logical high level and a logical low level of the global data line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory bank;
a global data line;
a first tri-state unit configured between the memory bank and the global data line;
a latch configured to provide a state signal based on a data signal provided from the memory bank;
a second tri-state unit configured between the global data line and the latch;
an output signal of the second tri-state unit being an inverting signal with respect to an input signal of the first tri-state unit; and
a pre-charge unit comprising:
a first n-type transistor and a first p-type transistor electrically coupled in series between a higher power supply node and the global data line; and
a second n-type transistor and a second p-type transistor electrically coupled in series between the global data line and a lower power supply node, wherein
during the global data line is caused to be electrically isolated from the memory bank by the first tri-state unit and from the latch by the second tri-state unit, a first pair of transistors are conducting, and one transistor of a second pair of transistors is conducting in response to the state signal;
each pair of the first pair of transistors and the second pair of transistors are correspondingly between the higher power supply node and the global data line and between the global data line and the lower power supply node;
the first pair of transistors are of opposite conductivity types; and
the second pair of transistors are transistors other than the first pair of transistors.

2. The memory device of claim 1, wherein
the state signal is non-inverting with respect to the data signal; and
the first pair of transistors are the first n-type transistor and the second p-type transistor.

3. The memory device of claim 1, wherein
the state signal is inverting with respect to the data signal; and
the first pair of transistors are the first p-type transistor and the second n-type transistor.

4. The memory device of claim 1, wherein
the state signal is inverting with respect to the data signal; and
the first pair of transistors are the first n-type transistor and the second p-type transistor.

5. The memory device of claim 1, wherein
the state signal is non-inverting with respect to the data signal; and
the first pair of transistors are the first p-type transistor and the second n-type transistor.

6. The memory device of claim 1, wherein
one of the first tri-state unit and the second tri-state unit is
a cascaded first inverter and first tri-state inverter, or
a first transmission gate; and
the other of the first tri-state unit and the second tri-state unit is
a second tri-state inverter, or
a cascaded second transmission gate and second inverter.

7. The memory device of claim 1, wherein
the latch latches the state signal in response to an assertion of a first control signal; and
the first control signal asserts during the global data line is caused to be electrically isolated from the memory bank by the first tri-state unit and from the latch by the second tri-state unit.

8. The memory device of claim 1, wherein
the first pair of transistors are conducting in response to assertions of a control signal pair; and
the control signal pair asserts during the global data line is caused to be electrically isolated from the memory bank by the first tri-state unit and from the latch by the second tri-state unit.

9. The memory device of claim 8, wherein the control signal pair are used to control the second tri-state unit.

10. A memory device, comprising:
a memory bank;
a global data line;
a first tri-state unit configured between the memory bank and the global data line;
a latch configured to provide a state signal based on a data signal provided from the memory bank;
a second tri-state unit configured between the global data line and the latch;
an output signal of the second tri-state unit is a non-inverting signal with respect to an input signal of the first tri-state unit; and
a pre-charge unit comprising:
a first n-type transistor and a first p-type transistor electrically coupled in series between a higher power supply node and the global data line; and
a second n-type transistor and a second p-type transistor electrically coupled in series between the global data line and a lower power supply node, wherein
during the global data line is caused to be electrically isolated from the memory bank by the first tri-state unit and from the latch by the second tri-state unit, a first pair of transistors are conducting, and one transistor of a second pair of transistors is conducting in response to the state signal;
each pair of the first pair of transistors and the second pair of transistors are correspondingly between the higher power supply node and the global data line and between the global data line and the lower power supply node;
the first pair of transistors are of opposite conductivity types; and
the second pair of transistors are transistors other than the first pair of transistors.

11. The memory device of claim 10, wherein
the state signal is non-inverting with respect to the data signal; and
the first pair of transistors are the first n-type transistor and the second p-type transistor.

12. The memory device of claim 10, wherein
the state signal is inverting with respect to the data signal; and
the first pair of transistors are the first p-type transistor and the second n-type transistor.

13. The memory device of claim 10, wherein
the state signal is inverting with respect to the data signal; and
the first pair of transistors are the first n-type transistor and the second p-type transistor.

14. The memory device of claim 10, wherein
the state signal is non-inverting with respect to the data signal; and
the first pair of transistors are the first p-type transistor and the second n-type transistor.

15. The memory device of claim 10, wherein
both of the first tri-state unit and the second tri-state unit are
a cascaded first inverter and first tri-state inverter, or
a first transmission gate; or
both of the first tri-state unit and the second tri-state unit are
a second tri-state inverter, or
a cascaded second transmission gate and second inverter.

16. The memory device of claim 10, wherein
the latch latches the state signal in response to an assertion of a first control signal; and
the first control signal asserts during the global data line is caused to be electrically isolated from the memory bank by the first tri-state unit and from the latch by the second tri-state unit.

17. The memory device of claim 10, wherein
the first pair of transistors are conducting in response to assertions of a control signal pair; and
the control signal pair asserts during the global data line is caused to be electrically isolated from the memory bank by the first tri-state unit and from the latch by the second tri-state unit.

18. The memory device of claim 17, wherein the control signal pair are used to control the second tri-state unit.

19. A method, comprising:
allowing a data signal resulted from a memory bank to be passed to a global data line;
preventing pre-charging the global data line during the data signal is allowed to be passed to the global data line;
electrically coupling the global data line to a latch during the data signal is allowed to be passed to the global data line;
latching a state signal based on the data signal by the latch;
electrically isolating the global data line from the memory bank;
electrically isolating the global data line from the latch during the global data line is electrically isolated from the memory bank; and
pre-charging the global data line to a first intermediate level or a second intermediate level depending on the state signal during the global data line is electrically isolated from the memory bank,
the first intermediate level and the second intermediate level being between a logical high level and a logical low level of the global data line.

20. The method of claim 19, wherein the latching the state signal based on the data signal is performed during the global data line is electrically isolated from the memory bank.

* * * * *